(12) United States Patent
Nomiya

(10) Patent No.: US 11,948,854 B2
(45) Date of Patent: Apr. 2, 2024

(54) ELECTRONIC COMPONENT AND ELECTRONIC COMPONENT MODULE INCLUDING THE SAME

(71) Applicant: Murata Manufacturing Co., Ltd., Nagaokakyo (JP)

(72) Inventor: Masato Nomiya, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 305 days.

(21) Appl. No.: 17/315,403

(22) Filed: May 10, 2021

(65) Prior Publication Data

US 2021/0265233 A1 Aug. 26, 2021

Related U.S. Application Data

(63) Continuation of application No. PCT/JP2019/044358, filed on Nov. 12, 2019.

(30) Foreign Application Priority Data

Nov. 14, 2018 (JP) .................................. 2018-214161

(51) Int. Cl.
*H01L 23/367* (2006.01)
*H01L 23/00* (2006.01)
(Continued)

(52) U.S. Cl.
CPC ........ *H01L 23/367* (2013.01); *H01L 23/3121* (2013.01); *H01L 24/16* (2013.01);
(Continued)

(58) Field of Classification Search
None
See application file for complete search history.

(56) References Cited

U.S. PATENT DOCUMENTS 5,285,352 A 2/1994 Pastore et al.
9,478,213 B2 * 10/2016 Tajima ................... G10K 11/18
(Continued)

FOREIGN PATENT DOCUMENTS

JP 06-97331 A 4/1994
JP 11-74421 A 3/1999
(Continued)

OTHER PUBLICATIONS

Official Communication issued in International Patent Application No. PCT/JP2019/044358, dated Jan. 28, 2020.

*Primary Examiner* — Long Pham
(74) *Attorney, Agent, or Firm* — Keating & Bennett, LLP

(57) ABSTRACT

An electronic component includes a substrate, a functional portion, external connection conductor portions, and first and second heat-conducting portions. The functional portion is located on first principal surface of the substrate and portion generates heat during operation. The external connection conductor portions are located directly on the first principal surface of the substrate or located below the first principal surface without direct contact with the substrate. The second principal surface of the substrate includes first and second regions. When viewed in plan in a thickness direction of the substrate, the first region does not overlap the functional portion, and the second region coincides with the functional portion. The first heat-conducting portion is located directly on all or a portion of the first region or located over all or a portion of the first region without direct contact with the substrate. The second heat-conducting portion is located directly on a region that is a portion of the second principal surface of the substrate and including at least a portion of the second region or located over the region without direct contact with the substrate and is discretely spaced away from the first heat-conducting por-
(Continued)

tion when viewed in plan in the thickness direction of the substrate.

9 Claims, 9 Drawing Sheets

(51) Int. Cl.
  *H01L 23/31* (2006.01)
  *H03H 9/145* (2006.01)
  *H03H 9/25* (2006.01)
  *H03H 9/64* (2006.01)

(52) U.S. Cl.
  CPC .............. *H03H 9/145* (2013.01); *H03H 9/25* (2013.01); *H03H 9/64* (2013.01); *H01L 2224/16227* (2013.01)

(56) References Cited

U.S. PATENT DOCUMENTS

| | | | |
|---|---|---|---|
| 2014/0118093 A1* | 5/2014 | Yamashita | H03H 9/1092 |
| | | | 333/186 |
| 2019/0140615 A1 | 5/2019 | Fujiya et al. | |

FOREIGN PATENT DOCUMENTS

| | | |
|---|---|---|
| JP | 2005-130412 A | 5/2005 |
| JP | 2009-088908 A | 4/2009 |
| JP | 2014-127678 A | 7/2014 |
| JP | 2016-181759 A | 10/2016 |
| WO | 2018/003819 A1 | 1/2018 |

\* cited by examiner

ELECTRONIC COMPONENT AND ELECTRONIC COMPONENT MODULE INCLUDING THE SAME

CROSS REFERENCE TO RELATED APPLICATIONS

This application claims the benefit of priority to Japanese Patent Application No. 2018-214161 filed on Nov. 14, 2018 and is a Continuation Application of PCT Application No. PCT/JP2019/044358 filed on Nov. 12, 2019. The entire contents of each application are hereby incorporated herein by reference.

BACKGROUND OF THE INVENTION

1. Field of the Invention

The present invention relates generally to an electronic component and an electronic component module including the same and, more specifically, to an electronic component including a functional portion that generates heat during operation and to an electronic component module including the electronic component.

2. Description of the Related Art

A known branching filter, which is an electronic component module, includes a wiring board, a transmission filter chip, and a reception filter chip (see, for example, Japanese Unexamined Patent Application Publication No. 2016-181759).

The transmission filter chip and the reception filter chip of the branching filter disclosed in Japanese Unexamined Patent Application Publication No. 2016-181759 are flip-chip mounted in a manner so as to face a flat upper surface of the wiring board with bumps being provided between the wiring board and the chips. The bumps may be made of metal, such as gold (Au).

The transmission filter chip and the reception filter chip are surface acoustic wave device chips each of which includes a piezoelectric substrate and an interdigital transducer (IDT) that is disposed on a surface of the piezoelectric substrate in a manner so as to face the wiring board. The transmission filter chip and the reception filter chip are subjected to heat generated in their respective IDTs during operation.

Japanese Unexamined Patent Application Publication No. 2016-181759 describes Example 3 in which a metal film is formed on an upper surface (opposite to a surface facing the wiring board) and all side surfaces of the transmission filter chip and is formed on an upper surface (opposite to a surface facing the wiring board) and all side surfaces of the reception filter chip. Japanese Unexamined Patent Application Publication No. 2016-181759 indicates that heat generated in heating elements of the acoustic wave device chips (electronic components) is dissipated by being transferred to solder with which the acoustic wave devices are sealed and by being transferred from the wiring board to a mounting substrate through the solder.

SUMMARY OF THE INVENTION

The metal film serving as a heat-dissipating path may eliminate or reduce the possibility that the heat generation will cause a breakdown or a property change in the electronic component disclosed in Japanese Unexamined Patent Application Publication No. 2016-181759 and an electronic component module including the electronic component. The metal film (heat-conducting portion) uniformly formed on the upper surface and all side surfaces of each chip included in the electronic component disclosed in Japanese Unexamined Patent Application Publication No. 2016-181759 seemingly renders the electronic component highly thermally conductive. However, the electronic component and the electronic component module including the electronic component are designed without regard to how the heat generated in a functional portion (e.g., the IDTs) would be efficiently transferred through external connection conductor portions (e.g., the bumps) for the case in which the functional portion and the external connection conductor portions are disposed on one of two principal surfaces of the substrate (e.g., the piezoelectric substrate) of the electronic component. In some cases, improved thermal dissipation properties are required of such an electronic component including a functional portion that generates heat during operation. Similarly, improved thermal dissipation properties may be required of an electronic component module including the electronic component.

Preferred embodiments of the present invention provide electronic components each capable of achieving an improvement in thermal dissipation properties, and provide electronic component modules each including the electronic component.

An electronic component according to an aspect of a preferred embodiment of the present invention includes a substrate, a functional portion, a plurality of external connection conductor portions, a first heat-conducting portion, and a second heat-conducting portion. The substrate includes two principal surfaces with one principal surface being opposite to other principal surface. The functional portion is disposed on the one principal surface of the substrate. The functional portion generates heat during operation. The plurality of external connection conductor portions are disposed directly on the one principal surface of the substrate or disposed below the one principal surface without direct contact with the substrate. The other principal surface of the substrate includes a first region and a second region. When viewed in plan in a thickness direction of the substrate, the first region does not overlap the functional portion, and the second region coincides with the functional portion. The first heat-conducting portion is disposed directly on all or a portion of the first region or disposed over all or a portion of the first region without direct contact with the substrate. Thermal conductivity of the first heat-conducting portion is higher than thermal conductivity of the substrate. The second heat-conducting portion is disposed directly on a region that is a portion of the other principal surface of the substrate and including at least a portion of the second region or is disposed over the region without direct contact with the substrate and is discretely spaced away from the first heat-conducting portion when viewed in plan in the thickness direction of the substrate. Thermal conductivity of the second heat-conducting portion is higher than the thermal conductivity of the substrate. When viewed in plan in the thickness direction of the substrate, a region that is a portion of the other principal surface of the substrate and located between the first heat-conducting portion and the second heat-conducting portion is not overlaid with a heat-conducting portion whose thermal conductivity is higher than the thermal conductivity of the substrate.

An electronic component according to another aspect of a preferred embodiment of the present invention includes a substrate, a functional portion, a plurality of external connection conductor portions, and a heat-conducting portion. The substrate includes two principal surfaces with one principal surface being opposite to other principal surface. The functional portion is disposed on the one principal surface of the substrate. The functional portion generates heat during operation. The plurality of external connection conductor portions are disposed directly on the one principal surface of the substrate or disposed below the one principal surface without direct contact with the substrate. The other principal surface of the substrate includes a first region and a second region. When viewed in plan in a thickness direction of the substrate, the first region does not overlap the functional portion, and the second region coincides with the functional portion. The heat-conducting portion is disposed directly on a region that is a portion of the other principal surface of the substrate and including at least a portion of the first region or is disposed over the region without direct contact with the substrate. Thermal conductivity of the heat-conducting portion is higher than thermal conductivity of the substrate. The second region is not entirely overlaid with the heat-conducting portion when viewed in plan in the thickness direction of the substrate.

An electronic component according to still another aspect of a preferred embodiment of the present invention includes a substrate, a functional portion, a plurality of external connection conductor portions, a first heat-conducting portion, a second heat-conducting portion, and a third heat-conducting portion. The substrate includes two principal surfaces with one principal surface being opposite to other principal surface. The functional portion is disposed on the one principal surface of the substrate. The functional portion generates heat during operation. The plurality of external connection conductor portions are disposed directly on the one principal surface of the substrate or disposed below the one principal surface without direct contact with the substrate. The other principal surface of the substrate includes a first region and a second region. When viewed in plan in a thickness direction of the substrate, the first region does not overlap the functional portion, and the second region coincides with the functional portion. The first heat-conducting portion is disposed directly on a portion of the first region or disposed over a portion of the first region without direct contact with the substrate. Thermal conductivity of the first heat-conducting portion is higher than thermal conductivity of the substrate. The second heat-conducting portion is disposed directly on a region that is a portion of the other principal surface of the substrate and including at least a portion of the second region or is disposed over the region without direct contact with the substrate and is discretely spaced away from the first heat-conducting portion when viewed in plan in the thickness direction of the substrate. Thermal conductivity of the second heat-conducting portion is higher than the thermal conductivity of the substrate. The third heat-conducting portion is disposed directly on a region that is a portion of the first region of the other principal surface of the substrate and located between the first heat-conducting portion and the second heat-conducting portion or disposed over the region without direct contact with the substrate. The third heat-conducting portion is joined to the first heat-conducting portion and the second heat-conducting portion. The third heat-conducting portion is thinner than each of the first heat-conducting portion and the second heat-conducting portion.

An electronic component according to still another aspect of a preferred embodiment of the present invention includes a substrate, a functional portion, a plurality of external connection conductor portions, and a heat-conducting portion. The substrate includes at least four side surfaces and two principal surfaces with one principal surface being opposite to other principal surface. The functional portion is disposed on the one principal surface of the substrate. The functional portion generates heat during operation. The plurality of external connection conductor portions are disposed directly on the one principal surface of the substrate or disposed below the one principal surface without direct contact with the substrate. The heat-conducting portion is disposed directly on only one of the at least four side surfaces that is closer than the other side surfaces of the substrate to the functional portion or disposed beside the side surface only without direct contact with the substrate. Thermal conductivity of the heat-conducting portion is higher than thermal conductivity of the substrate.

An electronic component module according to still another aspect of a preferred embodiment of the present invention includes the electronic component and a wiring board. The electronic component is mounted on the wiring board with the plurality of external connection conductor portions being in contact with the wiring board.

The electronic components and the electronic component modules according to preferred embodiments of the present invention yields an improvement in thermal dissipation properties.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

FIGS. 1 to 10, 12, and 13, which will be referred to in, for example, Preferred Embodiments 1 to 4, are schematic views, in which elements and components are not drawn to scale and the size and thickness ratios thereof may not fully correspond to the actual dimension ratios.

Preferred Embodiment 1

(1.1) Overall Configuration of Electronic Component and Electronic Component Module The following describes, with reference to FIGS. 1, 2, 3A, and 3B, an electronic component module 100, which includes an electronic component 1 according to Preferred Embodiment 1.

Figure 1:
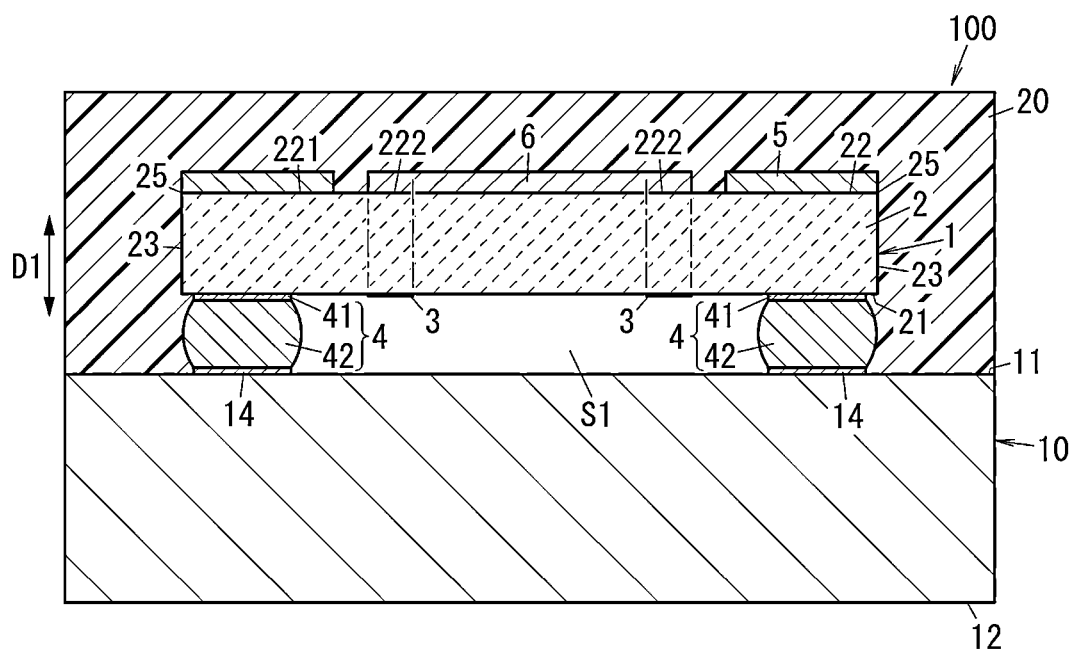
FIG. 1 is a sectional view of an electronic component module including an electronic component according to Preferred Embodiment 1 of the present invention.
Figure 2:
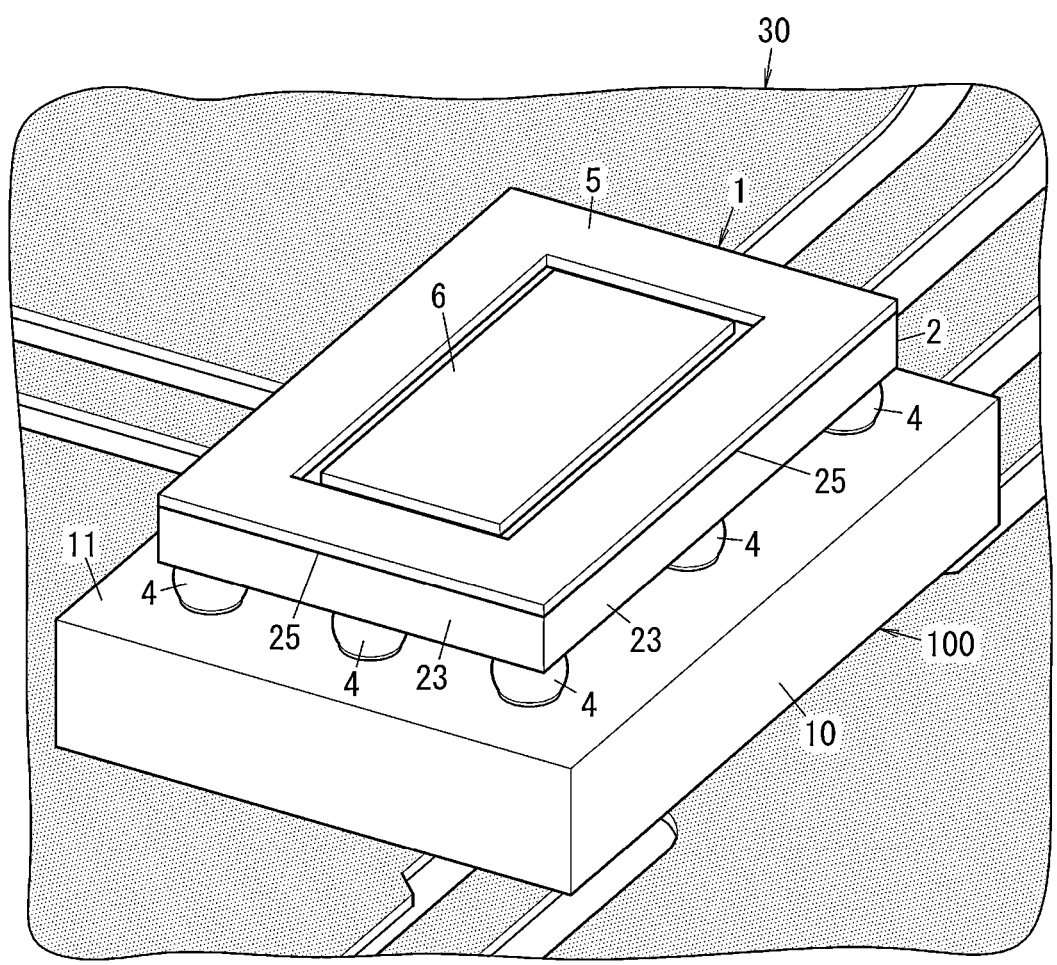
FIG. 2 is a perspective view of the electronic component module including the electronic component, illustrating the electronic component module mounted on a motherboard.

Referring to FIGS. 1 and 2, the electronic component module 100 according to Preferred Embodiment 1 includes the electronic component 1 and a wiring board 10. The electronic component 1 is mounted on the wiring board 10. Thus, the electronic component 1 and the wiring board 10 of the electronic component module 100 are electrically and mechanically connected to each other. The electronic component module 100 also includes a sealing resin portion 20, with which the electronic component 1 on the wiring board 10 is covered. The sealing resin portion 20 is not illustrated in FIG. 2. The electronic component 1, the wiring board 10, and the sealing resin portion 20 of the electronic component module 100 define a space S1.

The electronic component module 100 in actual use may be, for example, mounted on a motherboard 30. The electronic component module 100 may optionally include the motherboard 30. The motherboard 30 is a circuit board such as a printed wiring board.

The electronic component 1 includes a substrate 2, functional portions 3, external connection conductor portions 4, a first heat-conducting portion 5, and a second heat-conducting portion 6. The substrate 2 includes two principal surfaces, which are herein referred to as a principal surface 21 (a first surface) and a principal surface 22 (a second principal surface), respectively. The functional portions 3 are disposed on the principal surface 21 of the substrate 2. The functional portions generate heat during operation. The external connection conductor portions 4 are disposed directly on the principal surface 21 of the substrate 2. In some preferred embodiments, the external connection conductor portions 4 are disposed below the principal surface 21 of the substrate 2 without direct contact with the substrate 2. The external connection conductor portions 4 may be, for example, discretely spaced away from the functional portions 3 when viewed in the direction of the thickness of the substrate 2. The direction is herein referred to as thickness direction D1. The principal surface 22 of the substrate 2 includes a first region 221 and a second region 222. When viewed in plan in the thickness direction D1 of the substrate 2, the first region 221 does not overlap the functional portions 3, and the second region 222 coincides with the functional portions 3. The first heat-conducting portion 5 is disposed directly on all or a portion of the first region 221. In some preferred embodiments, the first heat-conducting portion 5 is disposed over all or a portion of the first region 221 without direct contact with the substrate 2. The thermal conductivity of the first heat-conducting portion 5 is higher than the thermal conductivity of the substrate 2.

The second heat-conducting portion 6 is disposed directly on a region that is a portion of the principal surface 22 of the substrate 2 and including at least a portion of the second region 222. In some preferred embodiments, the second heat-conducting portion 6 is disposed over a region that is a portion of the principal surface 22 and including at least a portion of the second region 222 without direct contact with the substrate 2. The second heat-conducting portion 6 is discretely spaced away from the first heat-conducting portion 5 when viewed in plan in the thickness direction D1 of the substrate 2. The thermal conductivity of the second heat-conducting portion 6 is higher than the thermal conductivity of the substrate 2.

(1.2) Elements of Electronic Component and Components of Electronic Component Module The following describes elements of the electronic component 1 with reference to the accompanying drawings. Components of the electronic component module 100 other than the electronic component 1 will be described thereafter.

The electronic component 1 may be, for example, an acoustic wave device including interdigital transducers (IDTs), which are herein referred to as the functional portions 3.

(1.2.1) Substrate

The substrate 2 includes the principal surface 21 and the principal surface 22, which are located on opposite sides in the thickness direction D1 of the substrate 2. The principal surface 21 is opposite to principal surface 22. The substrate 2 includes four side surfaces, each of which is denoted by 23. The outer shape of the substrate 2 viewed in the thickness direction D1 is rectangular. In some preferred embodiments, the outer shape of the substrate 2 is square. The substrate 2 may have a thickness of about 100 μm or more.

The substrate 2 may be, for example, a piezoelectric substrate. The piezoelectric substrate to be used may be, for example, a lithium niobate (LiNbO$_3$) substrate. In some preferred embodiments, a lithium tantalate (LiTaO$_3$) substrate or a quartz substrate is used.

(1.2.2) Functional Portion

The electronic component 1 includes more than one (e.g., two) functional portions 3, which are disposed on the principal surface 21 of the substrate 2. In some preferred embodiments, the electronic component 1 includes one functional portion 3 or includes three or more functional portions 3.

The functional portions 3 are IDT electrodes and are disposed on the principal surface 21 of the substrate 2. The IDT electrodes to be used may be made of metal such as aluminum (Al), copper (Cu), platinum (Pt), gold (Au), silver (Ag), titanium (Ti), nickel (Ni), chromium (Cr), molybdenum (Mo), or tungsten (W) or may be made of an alloy containing any one of these metals as a principal component. The IDT electrodes may have a multilayer structure including layers of the metal or layers of the alloy. The thickness of the substrate 2 of the electronic component 1 in Preferred Embodiment 1 is preferably equal to or more than 10λ, where λ denotes the wavelength of acoustic waves in units of μm and is determined by the spacing between adjacent electrode fingers of the IDT electrodes. The functional portions 3 may be, for example, electrically connected to at least two of the external connection conductor portion 4 through wiring layers. The wiring layers may be, for example, made of metal such as aluminum, copper, platinum, gold, silver, palladium, titanium, nickel, chromium, molybdenum, or tungsten or may be made of an alloy containing any one of these metals as a principal component. The wiring layers may have a multilayer structure including layers of the metal or layers of the alloy.

The IDT electrodes of the electronic component 1 may be included in the respective surface acoustic wave resonators, which are electrically connected to each other to define a filter. The filter may be, for example, a band-pass filter. The filter may, for example, a transmitting filter or a receiving filter. It is not required that the transmitting filter or the receiving filter be a band-pass filter. The transmitting filter or the receiving filter may be a high-pass filter. The surface acoustic wave resonators are known in abbreviated form as SAW resonators.

(1.2.3) External Connection Conductor Portion

The external connection conductor portions 4 each include a pad electrode 41 and a bump 42 on the pad electrode 41.

The pad electrode 41 may be, for example, made of metal such as aluminum, copper, platinum, gold, silver, palladium, titanium, nickel, chromium, molybdenum, or tungsten or may be made of an alloy containing any one of these metals as a principal component.

The pad electrode 41 may have a monolayer structure or a multilayer structure. The bump 42 is made of solder or may be, for example, made of gold (Au).

It is not required that the external connection conductor portions 4 of the electronic component 1 each include the pad electrode 41 and the bump 42. The external connection conductor portions 4 may each include only the pad electrode 41. Each of the pad electrodes 41 and the wiring layer corresponding thereto may be made of the same material and formed as one layer or may be formed as different layers.

The external connection conductor portions 4 are located on the inner side with respect to edges of the substrate 2 when viewed in plan in the thickness direction D1 of the substrate 2. The external connection conductor portions 4 are located on at least a peripheral portion of the substrate 2 when viewed in plan in the thickness direction D1 of the substrate 2. The external connection conductor portions 4 are aligned along the edges of the substrate 2 when viewed in plan in the thickness direction D1 of the substrate 2. The external connection conductor portions 4 are aligned around the functional portions 3 when viewed in plan in the thickness direction D1 of the substrate 2. The outer shape of each of the bumps 42 is circular or substantially circular. The outside diameter of each of the bumps 42 may be equal to or more than about 30 μm and equal to or less than about 200 μm and may be, for example, about 100 μm. It is not required that the outer shape of each of the bumps 42 be circular. The outer shape of each of the bumps 42 may be, for example, square or substantially square.

The wiring board 10 of the electronic component module 100 is provided with conductor portions 14. More specifically, the wiring board 10 of the electronic component module 100 includes a principal surface 11, which faces the electronic component 1. The conductor portions 14 each have a surface that is a portion of the principal surface 11. Each of the external connection conductor portions 4 faces the corresponding one of the conductor portions 14 on the wiring board 10 in the thickness direction D1 of the substrate 2 and is connected to the corresponding conductor portion 14.

One or more of the external connection conductor portions 4 are electrically connected to, for example, the functional portions 3 through the wiring layer on the principal surface 21 of the substrate 2. At least one of the external connection conductor portions 4 may not be electrically connected to, for example, the functional portions 3 and may thus be referred to as an independent external connection conductor portion. The independent external connection conductor portion is not intended for electrical connection. More specifically, the independent external connection conductor portion may be, for example, a dummy external connection conductor portion intended to increase the parallelism of the electronic component 1 and the wiring board 10, that is, to eliminate or reduce the possibility that the electronic component 1 will be mounted obliquely to the wiring board 10. Alternatively, the independent external connection conductor portion may be intended for dissipation of heat generated in the functional portions 3. Some of the external connection conductor portions 4 may be disposed close to the functional portions 3 to provide a portion of a heat-dissipating path through which heat generated in the functional portions 3 is dissipated. These external connection conductor portions 4 may be electrically connected to the functional portions 3 or connected to a ground electrode of the wiring board 10 or may be independent external connection conductor portions.

(1.2.4) First Heat-Conducting Portion and Second Heat-Conducting Portion

When viewed in plan in the thickness direction D1 of the substrate 2, the first region 221 of the principal surface 22 of the substrate 2 does not overlap the functional portions 3, and the second region 222 of the principal surface 22 of the substrate 2 coincides with the functional portions 3. The first heat-conducting portion 5 is disposed directly on a portion of the first region 221. The first heat-conducting portion 5 does not extend on the second region 222 of the principal surface 22 of the substrate 2. The second heat-conducting portion 6 is disposed directly on the second region 222 of the principal surface 22 of the substrate 2. The second heat-conducting portion 6 extends on the first region 221 of the principal surface 22 of the substrate 2. That is, the second heat-conducting portion 6 is located on both the second region 222 and the first region 221 so as to be discretely spaced away from the first heat-conducting portion 5.

The first heat-conducting portion 5 and the second heat-conducting portion 6 of the electronic component 1 according to Preferred Embodiment 1 are separate from each other. When viewed in plan in the thickness direction D1 of the substrate 2, the second heat-conducting portion 6 of the electronic component 1 according to Preferred Embodiment 1 is enclosed with the first heat-conducting portion 5 and is discretely spaced away from the first heat-conducting portion 5. The first heat-conducting portion 5 is spaced away from a boundary between the first region 221 and the second region 222 of the principal surface 22 of the substrate 2. The substrate 2 includes edge lines 25, where the side surfaces 23 of the substrate 2 meet the principal surface 22 of the substrate 2. Edges of the first heat-conducting portion 5 that do not face the second heat-conducting portion 6 coincide with the edge lines 25 where the side surfaces 23 meet the principal surface 22 of the substrate. In some preferred embodiments, the edges of the first heat-conducting portion 5 do not coincide with the edge lines 25.

The first heat-conducting portion 5 and the second heat-conducting portion 6 may be, for example, metal films. The metal films may be, for example, made of copper. The thickness of each of the metal film may be equal to or more than about 3 μm and equal to or less than about 50 μm and may be, for example, about 20 μm. As the thickness of the metal films increases, the heat transfer from the functional portions 3 through the metal films may be enhanced. However, unduly thick metal films are costly to produce and lead to an increase in the height of the electronic component 1. Such a structure may not be conducive to meeting the demands for more densification and more functionality. Thus, the first heat-conducting portion 5 and the second heat-conducting portion 6 each preferably have a thickness of about 50 μm or less and more preferably have a thickness of about 20 μm or less. With consideration given to thermal effects of the first heat-conducting portion 5 and the second heat-conducting portion 6 in light of efficient dissipation of heat from the functional portions 3 through the external connection conductor portions 4, the gap between the first heat-conducting portion 5 and the second heat-conducting portion 6 is preferably equal to or greater than about 20 μm.

It is not required that the metal films be made of copper. The metal films may be made of a copper alloy. Alternatively, the metal films may be, for example, made of metal such as aluminum, platinum, gold, silver, titanium, nickel, chromium, molybdenum, or tungsten or may be made of an alloy containing any one of these metals as a principal component. The metal films may have a monolayer structure or a multilayer structure. It is not required that the first heat-conducting portion 5 and the second heat-conducting portion 6 be made of metal. The first heat-conducting portion 5 and the second heat-conducting portion 6 may be, for example, made of aluminum nitride, silicon nitride, sapphire, or diamond. The first heat-conducting portion 5 and the second heat-conducting portion 6 may each include an aluminum nitride film on the principal surface 22 of the substrate 2 and a metal film stacked on the aluminum nitride film. The first heat-conducting portion 5 and the second heat-conducting portion 6 on the principal surface 22 of the substrate 2 of the electronic component 1 have the same thickness or substantially the same thickness. In some preferred embodiments, the first heat-conducting portion 5 and the second heat-conducting portion 6 are of different thicknesses. The first heat-conducting portion 5 and the second heat-conducting portion 6 of the electronic component 1 are made of the same material. In some preferred embodiments, first heat-conducting portion 5 and the second heat-conducting portion 6 are made of different materials.

(2) Wiring Board

The electronic component module 100 includes the wiring board 10 in addition to the electronic component 1. The electronic component 1 is mounted on the wiring board 10. The wiring board 10 includes the principal surface 11 and a principal surface 12. The surfaces of the conductor portions 14 are part of the principal surface 11. Surfaces of external connection electrodes are part of the principal surface 12. The principal surface 11 is opposite to principal surface 12 in the thickness direction of the wiring board 10. The electronic component module 100 includes one electronic component 1, which is mounted on the principal surface 11 of the wiring board 10. The wiring board 10 is greater than the substrate 2 when viewed in plan in the thickness direction D1 of the substrate 2. The outer shape of the wiring board 10 is rectangular. In some preferred embodiments, the outer shape of the wiring board 10 is square or substantially square. The wiring board 10 may be, for example, a printed wiring board. The wiring board 10 includes through-via electrodes that electrically connect the conductor portions 14 to the respective external connection electrodes.

It is not required that the wiring board 10 be a printed wiring board. In some preferred embodiments, the wiring board is a ceramic substrate or a ceramic multilayer substrate. Alternatively, the wiring board 10 may be an interposer that is a silicon substrate or may, for example, an electronic component including side-surface electrodes or through-via electrodes, an electronic component including side-surface electrodes and through-via electrodes, or any other electronic component that may be used as an interposer.

(3) Sealing Resin Portion

The sealing resin portion 20 is disposed on the wiring board 10 to cover the electronic component 1; that is, the electronic component 1 is sealed with the sealing resin portion 20. More specifically, the principal surface 22 and the side surfaces 23 of the substrate 2 of the electronic component 1 mounted on the wiring board 10 are directly or indirectly covered with the sealing resin portion 20. The sealing resin portion 20 is in contact with the first heat-conducting portion 5, the second heat-conducting portion 6, the side surfaces 23 of the substrate 2, and the region that is a portion of the principal surface 22 of the substrate 2 and covered with neither the first heat-conducting portion 5 nor the second heat-conducting portion 6. Each of the bumps 42 is partially covered with the sealing resin portion 20; or more specifically, the sealing resin portion 20 is in contact with exterior circumferential surfaces of the bumps 42. The electronic component module 100 according to Preferred Embodiment 1 includes the space S1, which is defined by the electronic component 1, the wiring board 10, and the sealing resin portion 20. The sealing resin portion 20 is provided in a manner so as not to cover the functional portions 3 of the electronic component 1. The space S1 in the electronic component module 100 is defined between the wiring board 10 and the functional portions 3 in the thickness direction D1 of the substrate 2.

The sealing resin portion 20 is a sealing portion with which the electronic component 1 is sealed. The sealing resin portion 20 may be, for example, made of an electrical insulating resin. The sealing resin portion 20 may be made from a mixture of the resin and a filler. The filler may be optionally added to the resin. The resin to be used may be, for example, an epoxy resin. In some preferred embodiments, a polyimide resin, an acrylic resin, a urethane resin, or a silicone resin is used in place of the epoxy resin. The filler to be used may be, for example, an inorganic filler, such as silica or alumina. The sealing resin portion 20 may contain, in addition to the resin and the filler, a black pigment, such as carbon black. The thermal conductivity of the sealing resin portion 20 is lower than the thermal conductivity of the first heat-conducting portion 5 and lower than the thermal conductivity of the second heat-conducting portion 6.

The electronic component module 100 may be, for example, a chip size package (CSP) electronic device, but not limited thereto. When viewed in plan in the thickness direction D1 of the substrate 2, the wiring board 10 and the sealing resin portion 20 of the electronic component module 100 are each slightly larger than the chip size of the electronic component 1.

The outer shape of the sealing resin portion 20 viewed in the thickness direction D1 of the substrate 2 is rectangular or substantially rectangular. In some preferred embodiments, the outer shape of the sealing resin portion 20 is square or substantially square. When viewed in plan in the thickness direction D1 of the substrate 2, the sealing resin portion 20 and the wiring board 10 are the same size or substantially the same size. It is not required that the wiring board 10 and the sealing resin portion 20 of the electronic component module 100 viewed in plan in the thickness direction D1 of the substrate 2 be the same size or substantially the same size. In some preferred embodiments, the wiring board 10 is larger than the sealing resin portion 20. In this case, none of the through-via electrodes may be provided in the wiring board 10, and the external connection electrodes may be disposed on the principal surface 11 of the wiring board 10.

(4) Method for Producing Electronic Component Module

The following briefly describes a method for producing the electronic component module 100.

In a preparatory step, a main body of the electronic component 1 is provided. The main body will be provided with the first heat-conducting portion 5, the second heat-conducting portion 6, and the bumps 42 later on. The preparatory step involves preparation of a wafer for providing main bodies of electronic components.

The preparatory step is followed by a heat-conducting portion forming step in which the first heat-conducting portion 5 and the second heat-conducting portion 6 are formed. Techniques such as sputtering, plating, and lithography are used in the heat-conducting portion forming step to form the first heat-conducting portion 5 and the second heat-conducting portion 6 on the principal surface 22 of the substrate 2 of each of the electronic component main bodies.

The heat-conducting portion forming step is followed by a cutting step in which the wafer is cut into the individual electronic components 1 with a dicing machine.

The cutting step is followed by a mounting step in which each of the electronic components 1 is flip-chip mounted on the principal surface 11 of the wiring board 10 by using the bumps 42.

The mounting step is followed by a sealing step in which the sealing resin portion 20 is formed. A thermosetting resin in a liquid state or in the form of pellets or a resin sheet may be used in the sealing step to form the sealing resin portion 20 with which the electronic component 1 on the wiring board 10 is covered.

Consequently, the electronic component module 100 is obtained; that is, the sealing step is the final step in producing the electronic component module 100.

Figure 3A:
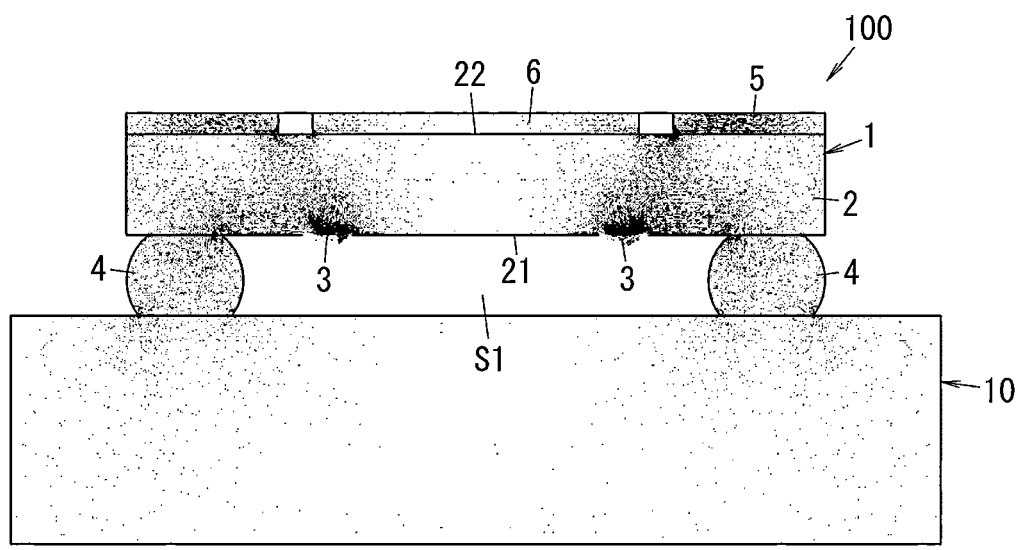
FIG. 3A illustrates the result of a simulation conducted on the electronic component module including the electronic component, or more specifically, thermal flux produced in the simulation.
Figure 3B:
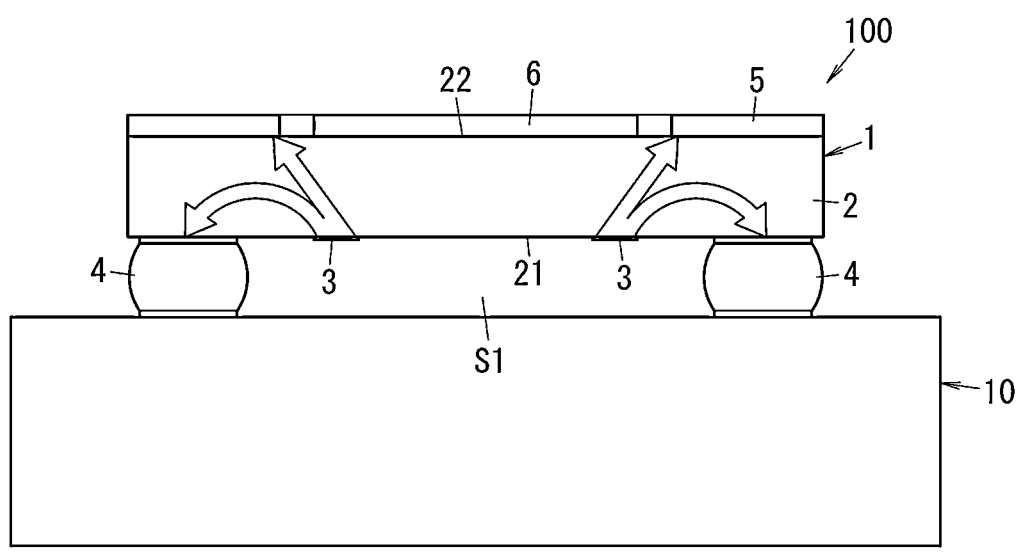
FIG. 3B is an explanatory drawing of a heat-dissipating path of the electronic component module including the electronic component.
Figure 4A:
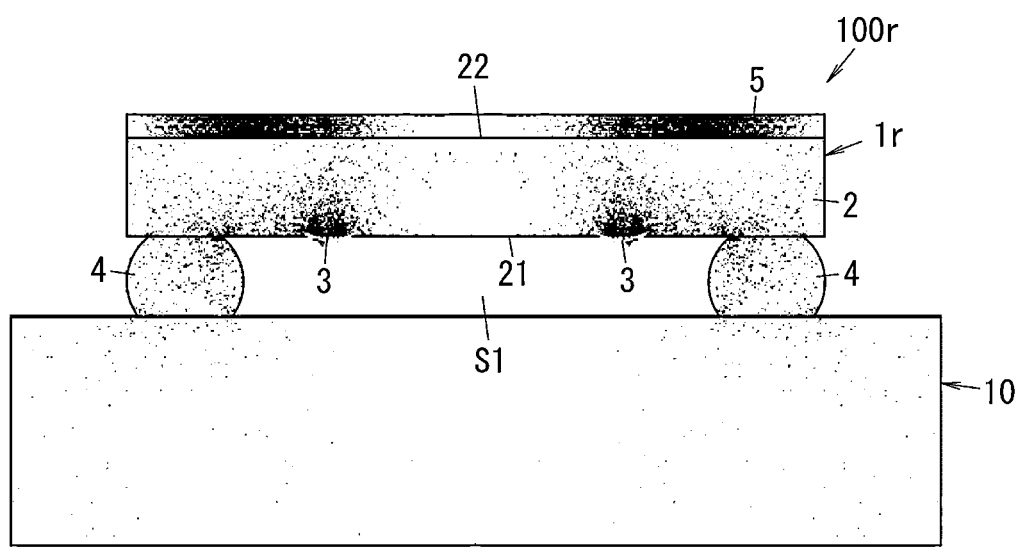
FIG. 4A illustrates the result of a simulation conducted on an electronic component module including an electronic component according to Comparative Example, or more specifically, thermal flux produced in the simulation.
Figure 4B:
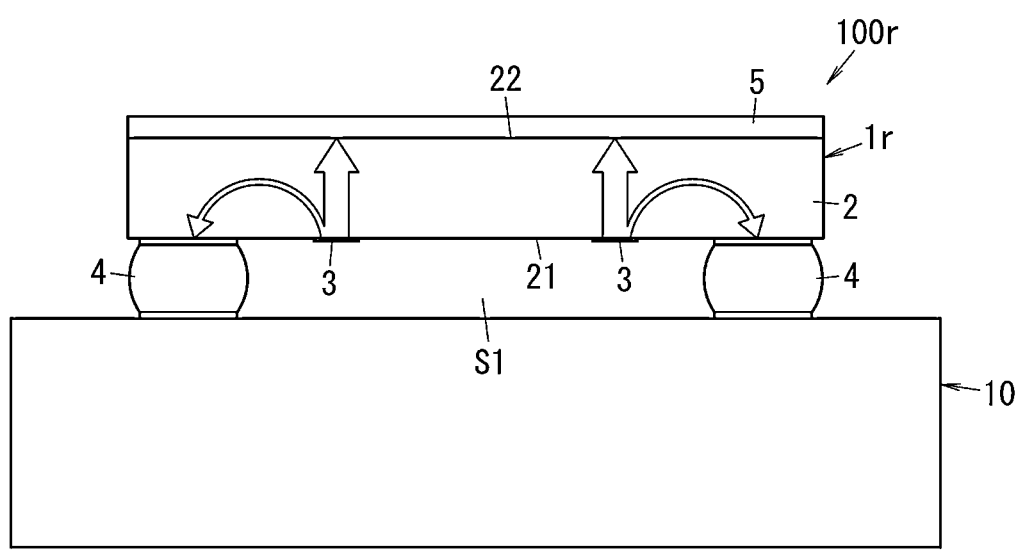
FIG. 4B is an explanatory drawing of a heat-dissipating path of the electronic component module including the electronic component according to Comparative Example.

As a preface for discussing, with reference to FIGS. 3A and 3B, a heat-dissipating path through which the electronic component 1 according to Preferred Embodiment 1 dissipates heat generated in the functional portions 3, the following describes, with reference to FIGS. 4A and 4B, a heat-dissipating path through which an electronic component 1r according to Comparative Example dissipates heat generated in the functional portions 3.

As can be seen from FIGS. 4A and 4B, the shape pattern of the heat-conducting portion 5 of the electronic component 1r according to Comparative Example is different from the shape pattern of the heat-conducting portion 5 of the electronic component 1 according to Preferred Embodiment 1. Elements of the electronic component 1r according to Comparative Example that are similar to the elements of the electronic component 1 according to Preferred Embodiment 1 are denoted by the same reference signs, and redundant description thereof will be omitted.

The first heat-conducting portion 5 of the electronic component 1r according to Comparative Example covers the entirety of the principal surface 22 of the substrate 2.

A simulation was conducted on an electronic component module 100r, which includes the electronic component 1r according to Comparative Example. FIG. 4A illustrates the result of the simulation, or more specifically, thermal flux produced by a flow of heat generated in the functional portions 3. It can be seen from FIG. 4A that heat generated in the functional portions 3 was prone to be transferred to the first heat-conducting portion 5 in the simulation conducted on the electronic component module 100r including the electronic component 1r according to Comparative Example. The heat-dissipating path of heat generated in the functional portions 3 was determined on the basis of the distribution of the thermal flux in FIG. 4A and is schematically indicated by arrows in FIG. 4B. The hollow arrows in FIG. 4B indicate that the thermal flux from the functional portions 3 to the first heat-conducting portion 5 was greater than the thermal flux passing through the external connection conductor portions 4 from the functional portions 3 to the wiring board 10.

FIG. 3A illustrates the result of a simulation conducted on the electronic component module 100 including the electronic component 1 according to Preferred Embodiment 1, or more specifically, thermal flux produced by a flow of heat generated in the functional portions 3. It can be seen from FIG. 3A that heat generated in the functional portions 3 was more prone to be transferred through the external connection conductor portions 4 to the wiring board 10 in the simulation conducted on the electronic component module 100 including the electronic component 1 according to Preferred Embodiment 1 than in the simulation conducted on the electronic component module 100r including the electronic component 1r according to Comparative Example. The heat-dissipating path of heat generated in the functional portions 3 was determined on the basis of the distribution of the thermal flux in FIG. 3A and is schematically indicated by arrows in FIG. 3B. The hollow arrows in FIG. 3B indicate that the thermal flux from the functional portions 3 to the first heat-conducting portion 5 was smaller and the thermal flux passing through the external connection conductor portions 4 from the functional portions 3 to the wiring board 10 was greater in the simulation conducted on the electronic component module 100 including the electronic component 1 according to Preferred Embodiment 1 than in the simulation conducted on the electronic component module 100r including the electronic component 1r according to Comparative Example.

Simulations conducted to determine the temperature distribution in the presence of heat generated in the functional portions 3 demonstrated that increases in the temperature of the functional portions 3 was suppressed to a greater extent in the electronic component module 100 including the electronic component 1 according to Preferred Embodiment 1 than in the electronic component module 100r including the electronic component 1r according to Comparative Example.

(5) Effects

The electronic component 1 according to Preferred Embodiment 1 includes the substrate 2, the functional portions 3, the external connection conductor portions 4, the first heat-conducting portion 5, and the second heat-conducting portion 6. The substrate 2 includes the principal surface 21 and the principal surface 22. The functional portions 3 are disposed on the principal surface 21 of the substrate 2. The functional portions 3 generate heat during operation. The external connection conductor portions 4 are disposed directly on the principal surface 21 of the substrate 2 or disposed below the principal surface 21 without direct contact with the substrate 2. The substrate 2 includes the first region 221 and the second region 222. When viewed in plan in the thickness direction D1 of the substrate 2, the first region 221 of the principal surface 22 does not overlap the functional portions 3, and the second region 222 of the principal surface 22 coincides with the functional portions 3. The first heat-conducting portion 5 is disposed directly on all or a portion of the first region 221 or disposed over all or a portion of the first region 221 without direct contact with the substrate 2. The thermal conductivity of the first heat-conducting portion 5 is higher than the thermal conductivity of the substrate 2. When viewed in plan in the thickness direction D1 of the substrate 2, the second heat-conducting portion 6 is disposed directly on a region that is a portion of the principal surface 22 of the substrate 2 and including at least a portion of the second region 222 or disposed over the region without direct contact with the substrate 2 and is discretely spaced away from the first heat-conducting portion 5. Referring to FIG. 1, the second heat-conducting portion 6 lies all over the second region 222. The thermal conductivity of the second heat-conducting portion 6 is higher than the thermal conductivity of the substrate 2. When viewed in plan in the thickness direction D1 of the substrate 2, a region that is a portion of the principal surface 22 of the substrate 2 and located between the first heat-conducting portion 5 and the second heat-conducting portion 6 is not overlaid with a heat-conducting portion whose thermal conductivity is higher than the thermal conductivity of the substrate 2.

The electronic component 1 according to Preferred Embodiment 1 yields an improvement in thermal dissipation properties. More specifically, the electronic component 1 according to Preferred Embodiment 1 enables efficient dissipation of heat from the functional portions 3 through a heat-dissipating path passing through the external connection conductor portions 4 and thus yields an improvement in thermal dissipation properties. Although the electronic component 1 does not include dedicated cooling mechanisms such as an air cooling mechanism and a heat sink, heat generated in the functional portions 3 is transferred through the external connection conductor portions 4 to the wiring board 10 and is efficiently dissipated accordingly. That is, the external connection conductor portions 4 of the electronic component 1 are effectively used as a portion of the heat transfer path. More specifically, heat generated in the functional portions 3 of the electronic component 1 is prone to be transferred not only to the first heat-conducting portion 5 far from the functional portions 3 but also to the external connection conductor portions 4 through the substrate 2. The electronic component 1 according to Preferred Embodiment 1 thus provides more heat-dissipating paths than the electronic component 1r according to Comparative Example in which the first heat-conducting portion 5 lies all over the principal surface 22 of the substrate 2. This is conductive to reducing increases in the temperature of the electronic component 1 in a state of operation. The first heat-conducting portion 5 of the electronic component 1 according to Preferred Embodiment 1 is neither on nor adjacent to the second region 222 of the principal surface 22 of the substrate 2. This layout causes heat generated in the functional portions 3 to be transferred preferentially to the first heat-conducting portion 5 and a peripheral region that is a portion of the substrate 2 and is closer than the functional portions 3 to the contour of the substrate 2 when viewed in plan in the thickness direction D1. The external connection conductor portions 4 that are close to the first heat-conducting portion 5 and to the peripheral region produce improved heat dissipation effect accordingly.

The first heat-conducting portion 5 of the electronic component 1 according to Preferred Embodiment 1 is opposite to external connection conductor portions 4 with the substrate 2 being located between the first heat-conducting portion 5 and the external connection conductor portions 4 in the thickness direction D1 of the substrate 2. This layout causes heat generated in the functional portions 3 to become more concentrated in the external connection conductor portions 4, thus leading to an improvement in the thermal dissipation properties of the electronic component 1 according to Preferred Embodiment 1.

Additionally, heat generated in the functional portions 3 is partially transferred to the second heat-conducting portion 6, thus leading to a further improvement in the thermal dissipation properties of the electronic component 1 according to Preferred Embodiment 1.

The electronic component module 100 according to Preferred Embodiment 1 includes the electronic component 1 and the wiring board 10 on which the electronic component 1 is mounted with the external connection conductor portions 4 being in contact with the wiring board 10. This configuration leads to an improvement in the thermal dissipation properties of the electronic component module 100 according to Preferred Embodiment 1.

The electronic component module 100 according to Preferred Embodiment 1 also includes the sealing resin portion 20. The electronic component 1 on the wiring board 10 is covered with the sealing resin portion 20. While the electronic component 1 of the electronic component module 100 is sealed with the sealing resin portion 20, heat generated in the functional portions 3 can be less prone to be dissipated through the substrate 2 and the sealing resin portion 20. Nevertheless, the heat generated in the functional portions 3 is more prone to be transferred to the wiring board 10 through the substrate 2 and the external connection conductor portions 4. In this way, the heat dissipation effect is efficiently produced. In the case that the electronic component module 100 in actual use is mounted on the motherboard 30, heat transferred to the wiring board 10 is further transferred to the motherboard 30. In this way, the heat dissipation effect is more efficiently produced.

The electronic component module 100 according to Preferred Embodiment 1 includes the space S1, which is defined by the electronic component 1, the wiring board 10, and the sealing resin portion 20. In the electronic component module 100, the functional portions 3 face the wiring board 10 with at least the space S1 being defined therebetween. That is, the space S1 in the electronic component module 100 according to Preferred Embodiment 1 is defined between the wiring board 10 and the functional portions 3. Although the space S1 in the electronic component module 100 is defined between the wiring board 10 and the functional portion 3, heat generated in the functional portions 3 is more prone to be transferred to the wiring board 10 through the substrate 2 and the external connection conductor portions 4. In this way, the heat dissipation effect is efficiently produced.

First Modification of Preferred Embodiment 1

Figure 5:
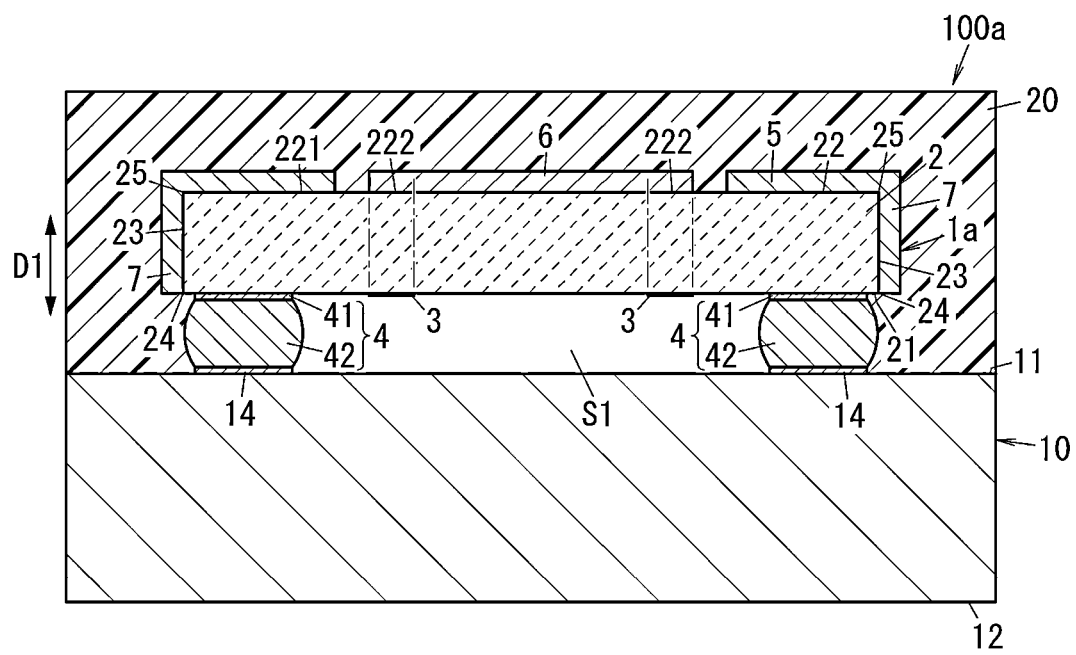
FIG. 5 is a sectional view of an electronic component module including an electronic component according to a first modification of Preferred Embodiment 1 of the present invention.

The following describes, with reference to FIG. 5, an electronic component 1a according to a first modification of Preferred Embodiment 1 and an electronic component module 100a, which includes the electronic component 1a.

The electronic component 1a according to the first modification differs from the electronic component 1 according to Preferred Embodiment 1 in that the electronic component 1a further includes lateral heat-conducting portions 7. The electronic component 1a according to the first modification includes more than one lateral heat-conducting portion 7 (four lateral heat-conducting portions 7). The lateral heat-conducting portions 7 are disposed directly on the four respective side surfaces 23 of the substrate 2. It is not required that the lateral heat-conducting portions 7 of the electronic component 1a be disposed directly on the respective side surfaces 23. The lateral heat-conducting portions 7 may be disposed beside the respective side surfaces 23 without direct contact with the substrate 2. Elements of the electronic component 1a according to the first modification that are similar to the elements of the electronic component 1 according to Preferred Embodiment 1 are denoted by the same reference signs, and redundant description thereof will be omitted. The same holds for the components of the electronic component module 100a according to the first modification that are similar to the components of the electronic component module 100 according to Preferred Embodiment 1.

The thermal conductivity of the lateral heat-conducting portions 7 of the electronic component 1a is greater than the thermal conductivity of the substrate 2.

The lateral heat-conducting portions 7 may be, for example, metal films. The metal films may be, for example, made of copper. It is not required that the metal films be made of copper. The metal films may be made of a copper alloy. Alternatively, the metal films may be, for example, made of metal such as aluminum, platinum, gold, silver, titanium, nickel, chromium, molybdenum, or tungsten or may be made of an alloy containing any one of these metals as a principal component. The four lateral heat-conducting portions 7 are joined to the first heat-conducting portion 5 on the substrate 2. More specifically, the four lateral heat-conducting portions 7 are integral with the first heat-conducting portion 5. The four lateral heat-conducting portions 7 are not joined to the second heat-conducting portion 6 on the substrate 2. The four lateral heat-conducting portions 7 of the electronic component 1a are incorporated in one in such a manner that any two of the lateral heat-conducting portions 7 adjacent to each other along the edges of the substrate 2 are joined to each other.

At least a portion of each of the lateral heat-conducting portions 7 is opposite to functional portion 3 with the corresponding one of the external connection conductor portions 4 being located therebetween. When viewed in plan in the thickness direction D1 of the substrate 2, one of the external connection conductor portions 4 is located between at least a portion of the corresponding lateral heat-conducting portion 7 and the functional portion 3.

The following briefly describes a non-example of a method for producing the electronic component module 100a.

In a preparatory step, a main body of the electronic component 1a is provided. The main body will be provided with the first heat-conducting portion 5, the second heat-conducting portion 6, the lateral heat-conducting portions 7, and the bumps 42 later on. The preparatory step involves preparation of a wafer for providing main bodies of electronic components.

The preparatory step is followed by a cutting step in which a wafer placed on a wafer tape (an adhesive resin tape) is cut into individual electronic component main bodies.

The cutting step is followed by an expansion step in which the wafer tape is stretched by, for example, an expanding device to increase the clearance between adjacent ones of the electronic component main bodies.

The expansion step is followed by a heat-conducting portion forming step in which the first heat-conducting portion 5, the second heat-conducting portion 6, and the lateral heat-conducting portions 7 are formed. Techniques such as sputtering, plating, and lithography are used in the heat-conducting portion forming step to form the first heat-conducting portion 5 and the second heat-conducting portion 6 on the principal surface 22 of the substrate 2 of each of the electronic component main bodies on the wafer tape and to form the lateral heat-conducting portions 7 on the side surfaces 23 of the substrate 2 of each of the electronic component main bodies on the wafer tape. Alternatively, the step of cutting the wafer into individual electronic component main bodies may be preceded with the step of forming the first heat-conducting portions 5 and the second heat-conducting portions 6 for the electronic component main bodies. The wafer is then cut into individual electronic component bodies. With the principal surface 22 of the substrate 2 of each of the electronic component main bodies being masked off, the lateral heat-conducting portions 7 may be formed on the respective side surfaces 23 of the substrate 2 of each of the electronic component main bodies. That is, the method for producing the electronic component module 100a may be modified in such a manner that the first heat-conducting portion 5 and the second heat-conducting portion 6 are formed in one step and the lateral heat-conducting portions 7 are formed in another step. Not only the exposed region of the principal surface 22 of the substrate 2 of each of the electronic component main bodies but also the exposed region of the principal surface 21 of the substrate 2 of each of the electronic component main bodies may be masked off in the step of forming the lateral heat-conducting portions 7.

The heat-conducting portion forming step is followed by a mounting step in which each of the electronic components 1a is flip-chip mounted on the principal surface 11 of the wiring board 10 by using the bumps 42.

The mounting step is followed by a sealing step in which the sealing resin portion 20 is formed. A thermosetting resin in a liquid state or in the form of pellets or a resin sheet may be used in the sealing step to form the sealing resin portion 20 with which the electronic component 1a on the wiring board 10 is covered.

Consequently, the electronic component module 100a is obtained; that is, the sealing step is the final step in producing the electronic component module 100a.

With the lateral heat-conducting portions 7 being included in the electronic component 1a according to the first modification of Preferred Embodiment 1, heat generated in the functional portions 3 is transferred preferentially to the first heat-conducting portion 5 and a peripheral region that is a portion of the substrate 2 and is closer than the functional portions 3 to the lateral heat-conducting portions 7 when viewed in plan in the thickness direction D1. The external connection conductor portions 4 that are close to the first heat-conducting portion 5 and to the peripheral region produce improved heat dissipation effect accordingly. In this respect, the electronic component 1a according to the first modification of Preferred Embodiment 1 offers an improvement over the electronic component 1 according to Preferred Embodiment 1. More specifically, the lateral heat-conducting portions 7 are physically close to the external connection conductor portions 4. This layout enables the electronic component 1a according to the first modification to achieve superiority in thermal dissipation properties over the electronic component 1 according to Preferred Embodiment 1.

The substrate 2 includes the edge lines 25, where the four side surfaces 23 corresponding to the respective lateral heat-conducting portions 7 meet the principal surface 22 of the substrate 2. The substrate 2 also includes edge lines 24, where the four side surfaces 23 corresponding to the respective lateral heat-conducting portions 7 meet the principal surface 21 of the substrate 2. Each of the lateral heat-conducting portions 7 of the electronic component 1a according to the first modification of Preferred Embodiment 1 extends from the corresponding one of the edge lines 25 to the corresponding one of the edge lines 24. Thus, the physical distance between each of the lateral heat-conducting portions 7 and the external connection conductor portion 4 close to the lateral heat-conducting portion 7 concerned is shorter in this layout than in the case that each of the lateral heat-conducting portions 7 does not extend to the corresponding one of the edge lines 24. The electronic component 1a according to the first modification of Preferred Embodiment 1 yields an improvement in thermal dissipation properties accordingly.

It is not required that four lateral heat-conducting portions 7 be included in the electronic component 1a. The electronic component 1a may, for example, include one, two, or three lateral heat-conducting portions 7. Each of the lateral heat-conducting portions 7 may be divided into discrete sections on the corresponding one of the side surfaces 23 of the substrate 2. In light of thermal dissipation properties, each of the lateral heat-conducting portions 7 is preferably divided in a manner so as to ensure that the lateral heat-conducting portions 7 lie over regions of the side surfaces 23 that are closer than the other regions of the side surfaces 23 to the external connection conductor portions 4. In the step of forming the lateral heat-conducting portions 7, the side surfaces 23 of the substrate 2 may each be partially masked off by an appropriate means before the lateral heat-conducting portions 7 are patterned. The lateral heat-conducting portions 7 may be patterned by using the following procedure. A metal film that is to be formed into the lateral heat-conducting portions 7 is formed on the side surfaces 23 of the substrate 2. With portions of the metal film that need to remain intact being masked off, the metal film is etched to remove unwanted portions.

Second Modification of Preferred Embodiment 1

Figure 6:
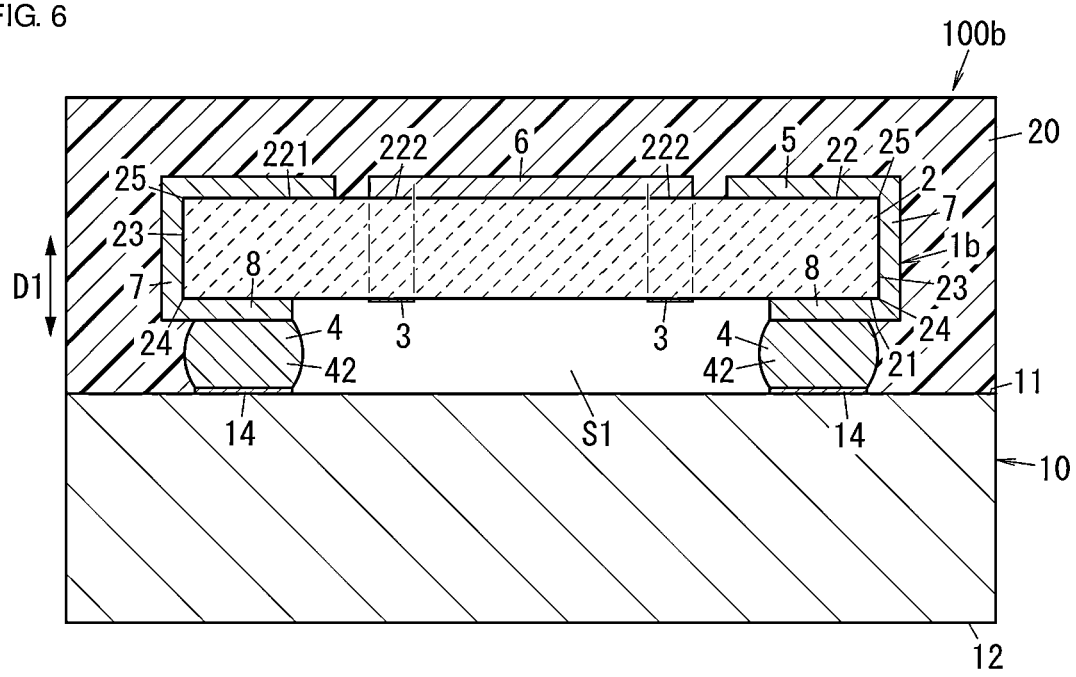
FIG. 6 is a sectional view of an electronic component module including an electronic component according to a second modification of Preferred Embodiment 1 of the present invention.

The following describes, with reference to FIG. 6, an electronic component 1b according to a second modification of Preferred Embodiment 1 and an electronic component module 100b, which includes the electronic component 1b.

The electronic component 1b according to the second modification differs from the electronic component 1a according to the first modification (see FIG. 5) in that the electronic component 1b further includes a heat-conducting portion 8 (a heat-conducting portions on one principal surface side), which extends from the lateral heat-conducting portions 7 and lies on the principal surface 21 of the substrate 2. The thermal conductivity of the heat-conducting portion 8 is higher than the thermal conductivity of the substrate 2. Elements of the electronic component 1b according to the second modification that are similar to the elements of the electronic component 1a according to the first modification are denoted by the same reference signs, and redundant description thereof will be omitted. The same holds for the components of the electronic component module 100b according to the second modification that are similar to the components of the electronic component module 100a according to the first modification.

The heat-conducting portion 8 of the electronic component 1b according to the second modification is disposed directly on the principal surface 21 of the substrate 2. Alternatively, the heat-conducting portion 8 may be disposed below the principal surface 21 of the substrate 2 without direct contact with the substrate 2.

The heat-conducting portion 8 may be, for example, a metal film. The metal film may be, for example, made of copper. It is not required that the metal film be made of copper. The metal film may be made of a copper alloy. Alternatively, the metal film may be, for example, made of metal such as aluminum, platinum, gold, silver, titanium, nickel, chromium, molybdenum, or tungsten or may be made of an alloy containing any one of these metals as a principal component. The heat-conducting portion 8 and the lateral heat-conducting portions 7 are joined to each other on the substrate 2. The heat-conducting portion is opposite to first heat-conducting portion 5 with the substrate 2 being located therebetween in the thickness direction D1 of the substrate 2. The heat-conducting portion 8 and the first heat-conducting portion 5 have the same thickness. Alternatively, the heat-conducting portion 8 may be thinner or thicker than the first heat-conducting portion 5.

The heat-conducting portion 8 on the principal surface of the substrate 2 is discretely spaced away from the functional portions 3. Some of the external connection conductor portions 4 of the electronic component 1b according to the second modification are disposed directly on the heat-conducting portion 8 for the purpose of dissipating heat.

The heat-conducting portion 8 on the principal surface of the substrate 2 enhances transfer of heat from the functional portions 3 to the external connection conductor portions 4, thus enabling the electronic component 1b according to the second modification to achieve superiority in thermal dissipation properties over the electronic component 1a according to the first modification.

Third Modification of Preferred Embodiment 1

Figure 7:
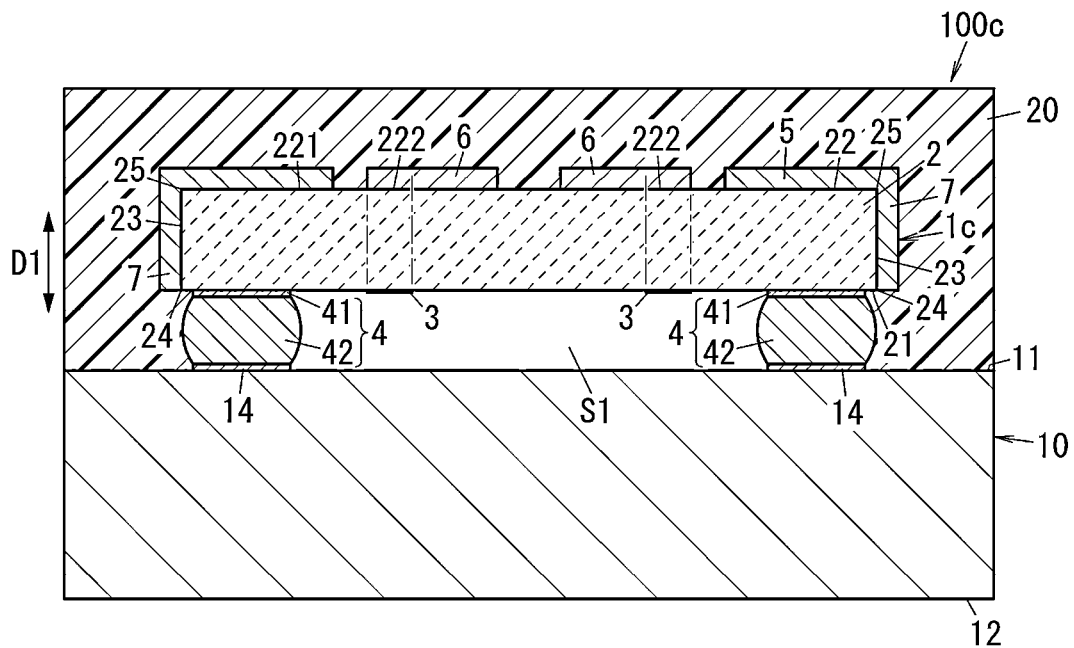
FIG. 7 is a sectional view of an electronic component module including an electronic component according to a third modification of Preferred Embodiment 1 of the present invention.

The following describes, with reference to FIG. 7, an electronic component 1c according to a third modification of Preferred Embodiment 1 and an electronic component module 100c, which includes the electronic component 1c.

The electronic component 1c according to the third modification differs from the electronic component 1a according to the first modification (see FIG. 5) in that the second heat-conducting portion 6 of the electronic component 1c is divided into two discrete sections. Elements of the electronic component 1c according to the third modification that are similar to the elements of the electronic component 1a according to the first modification are denoted by the same reference signs, and redundant description thereof will be omitted. The same holds for the components of the electronic component module 100c according to the third modification that are similar to the components of the electronic component module 100a according to the first modification.

The second heat-conducting portion 6 divided into two discrete sections enhances transfer of heat from the functional portions 3 to the first heat-conducting portion 5 and to the external connection conductor portions 4, thus enabling the electronic component 1c according to the third modification to achieve superiority in thermal dissipation properties over the electronic component 1a according to the first modification.

Preferred Embodiment 2

Figure 8:
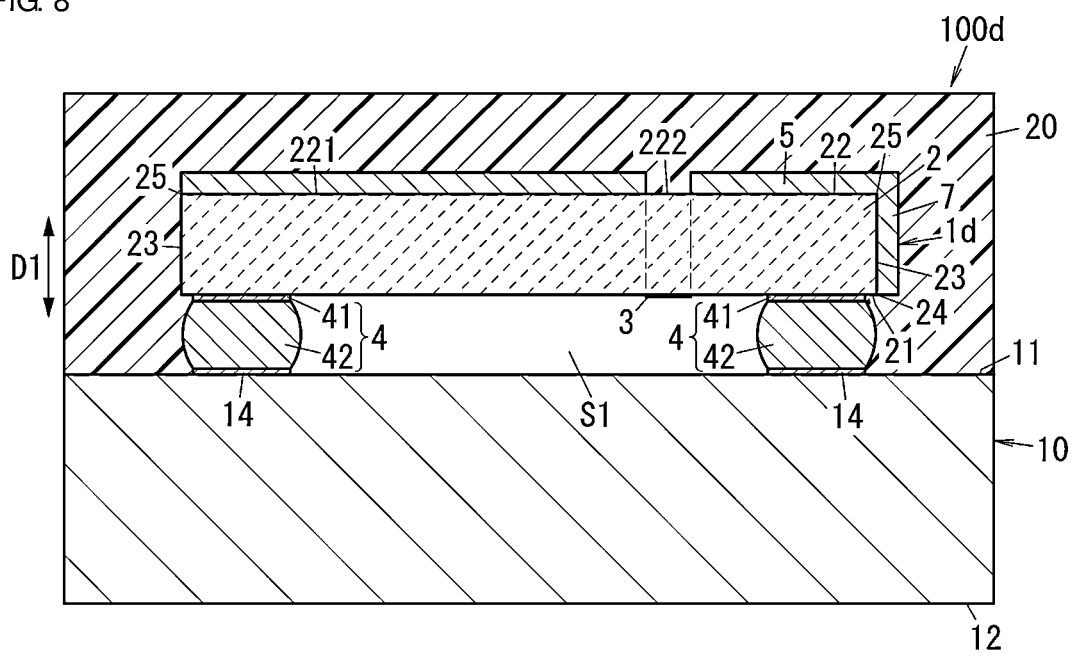
FIG. 8 is a sectional view of an electronic component module including an electronic component according to Preferred Embodiment 2 of the present invention.

The following describes, with reference to FIG. 8, an electronic component 1d according to Preferred Embodiment 2 and an electronic component module 100d, which includes the electronic component 1d.

The electronic component 1d according to Preferred Embodiment 2 differs from the electronic component 1a according to the first modification of Preferred Embodiment 1 (see FIG. 5) in that the electronic component 1d does not include the second heat-conducting portion 6. The first heat-conducting portion 5 of the electronic component 1d is hereinafter also referred to as the heat-conducting portion 5. Elements of the electronic component 1d according to Preferred Embodiment 2 that are similar to the elements of the electronic component 1a according to the first modification of Preferred Embodiment 1 are denoted by the same reference signs, and redundant description thereof will be omitted. The same holds for the components of the electronic component module 100d according to Preferred Embodiment 2 that are similar to the components of the electronic component module 100a according to the first modification of Preferred Embodiment 1.

The electronic component 1d according to Preferred Embodiment 2 includes only one functional portion 3. The second heat-conducting portion 6 (see FIG. 5) is not disposed on the second region 222 of the principal surface 22 of the substrate 2 of the electronic component 1d. Thus, heat generated in the functional portion 3 of the electronic component 1d is prone to be transferred to the external connection conductor portions 4 close to the functional portion 3.

The electronic component 1d according to Preferred Embodiment 2 includes the substrate 2, the functional portion 3, the external connection conductor portions 4, and the heat-conducting portion 5. The substrate 2 includes the principal surface 21 and the principal surface 22. The functional portion 3 is disposed on the principal surface 21 of the substrate 2. The functional portion 3 generates heat during operation. The external connection conductor portions 4 are disposed directly on the principal surface 21 of the substrate 2 or disposed below the principal surface 21 without direct contact with the substrate 2. When viewed in plan in the thickness direction D1 of the substrate 2, the first region 221 of the principal surface 22 of the substrate 2 does not overlap the functional portion 3, and the second region 222 of the principal surface 22 of the substrate 2 coincides with the functional portions 3. The first heat-conducting portion 5 is disposed directly on a region that is a portion of the principal surface 22 and including at least a portion of the first region 221 or disposed over the region without direct contact with the substrate 2. The thermal conductivity of the heat-conducting portion 5 is higher than the thermal conductivity of the substrate 2. The second region 222 is not entirely overlaid with the heat-conducting portion 5 when viewed in plan in the thickness direction D1 of the substrate 2. Thus, heat generated in the functional portions 3 of the electronic component 1d is prone to be transferred to the external connection conductor portions 4 close to the functional portion 3. The electronic component 1d yields an improvement in thermal dissipation properties accordingly. The heat-conducting portion 5 may extend on the second region 222 when viewed in plan in the thickness direction D1 of the substrate 2. In this case, a portion of the second region 222 is not overlaid with the heat-conducting portion 5.

The second region 222 of the principal surface 22 of the substrate 2 is overlaid with the sealing resin portion 20 of the electronic component module 100d. The sealing resin portion 20 is in contact with the second region 222 of the principal surface 22 of the substrate 2.

The lateral heat-conducting portion 7 of the electronic component 1d according to Preferred Embodiment 2 is directly disposed on only the side surface 23 that is closer than the other three side surfaces 23 of the substrate 2 to the functional portion 3. Thus, heat generated in the functional portions 3 of the electronic component 1d is prone to be transferred to the external connection conductor portions 4 close to the lateral heat-conducting portion 7. The lateral heat-conducting portion 7 may, without direct contact with the substrate 2, be disposed beside only the side surface 23 that is closer than the other three side surfaces 23 of the substrate 2 to the functional portion 3.

Modification of Preferred Embodiment 2

Figure 9:
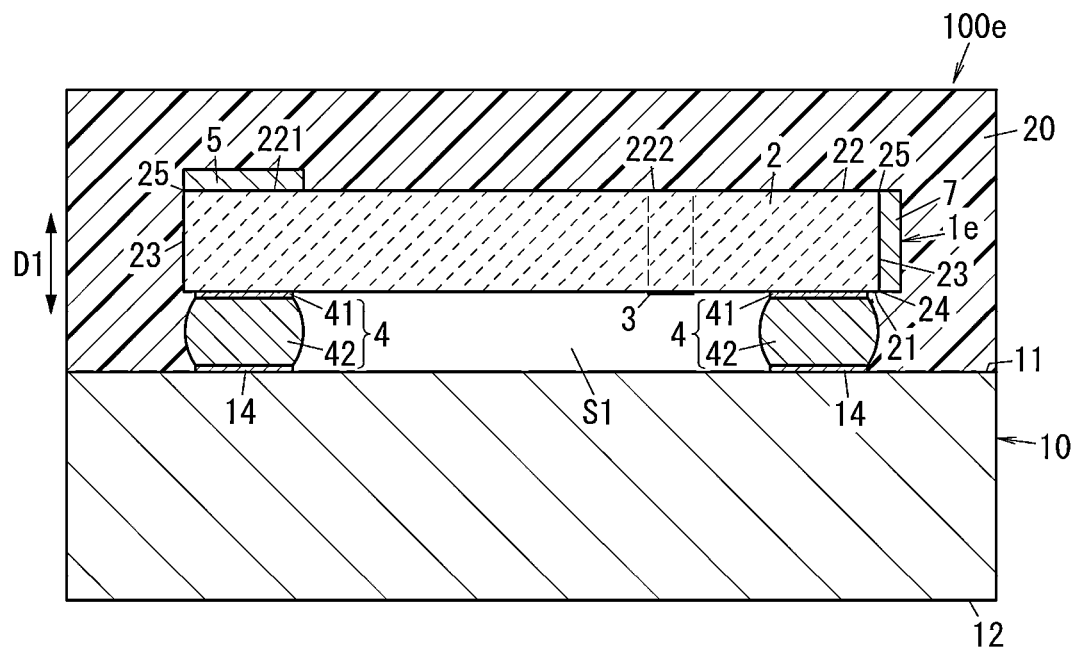
FIG. 9 is a sectional view of an electronic component module including an electronic component according to a modification of Preferred Embodiment 2 of the present invention.

The following describes, with reference to FIG. 9, an electronic component 1e according to a modification of Preferred Embodiment 2 and an electronic component module 100e, which includes the electronic component 1e.

The difference between the electronic component 1d according to Preferred Embodiment 2 and the electronic component 1e according to the modification is in the pattern of the heat-conducting portion 5. Elements of the electronic component 1e according to the modification that are similar to the elements of the electronic component 1d according to Preferred Embodiment are denoted by the same reference signs, and redundant description thereof will be omitted. The same holds for the components of the electronic component module 100e according to the modification that are similar to the components of the electronic component module 100d according to Preferred Embodiment 2.

The electronic component 1e according to the modification includes one functional portion 3. The functional portion 3 of the electronic component 1e according to the modification is closer to an edge of the substrate 2 than to the center of the principal surface 21 of the substrate 2. The lateral heat-conducting portion 7 of the electronic component 1e according to the modification is disposed on only the side surface 23 that is closer than the other three side surfaces 23 of the substrate 2 to the functional portion 3. The heat-conducting portion 5 of the electronic component 1e according to the modification is disposed on a region that is part of the first region 221 of the principal surface 22 of the substrate 2 and far from the second region 222.

A method for producing the electronic component 1e according to the modification may include a step of forming the heat-conducting portion 5 and a step of forming the lateral heat-conducting portion 7. In this case, the lateral heat-conducting portions 7 may be formed on the side surfaces 23 of the substrate 2 with the principal surface 22 of the substrate 2 being masked off. Alternatively, a metal film may be formed on the principal surface 22 and the side surfaces 23 of the substrate 2. With portions of the metal film that need to remain intact being masked off, the metal film may be etched to remove unwanted portions.

The heat-conducting portion 5 of the electronic component 1e according to the modification is disposed on a region that is part of the first region 221 of the principal surface 22 of the substrate 2 and far from the second region 222. Thus, heat generated in the functional portion 3 of the electronic component 1e is more prone to be transferred to the external connection conductor portions 4 close to the functional portion 3 than heat generated in the functional portion 3 of the electronic component 1d of Preferred Embodiment 2.

Preferred Embodiment 3

Figure 10:
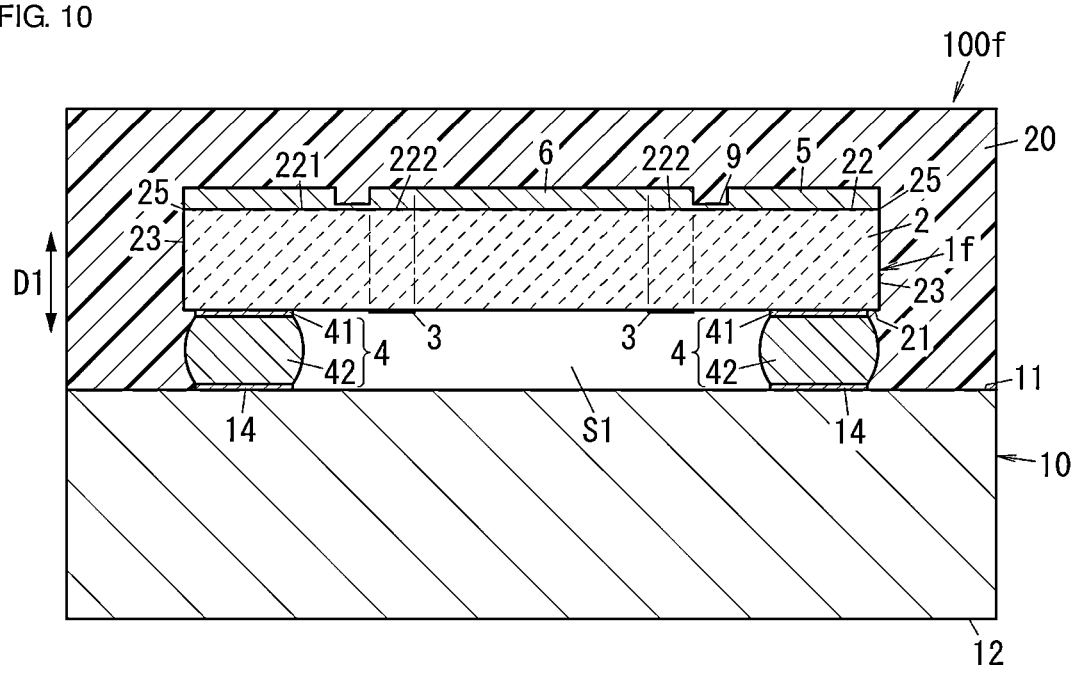
FIG. 10 is a sectional view of an electronic component module including an electronic component according to Preferred Embodiment 3 of the present invention.

The following describes, with reference to FIG. 10, an electronic component 1f according to Preferred Embodiment 3 and an electronic component module 100f, which includes the electronic component 1f.

The electronic component 1f according to Preferred Embodiment 3 differs from the electronic component 1 according to Preferred Embodiment 1 (see FIGS. 1 and 2) in that the electronic component 1f further includes a third heat-conducting portion 9, which is located between the first heat-conducting portion 5 and the second heat-conducting portion 6 and is thinner than each of the first heat-conducting portion 5 and the second heat-conducting portion 6. Elements of the electronic component 1f according to Preferred Embodiment 3 that are similar to the elements of the electronic component 1 according to Preferred Embodiment 1 are denoted by the same reference signs, and redundant description thereof will be omitted. The same holds for the components of the electronic component module 100f according to Preferred Embodiment 3 that are similar to the components of the electronic component module 100 according to Preferred Embodiment 1.

The third heat-conducting portion 9 is integral with the first heat-conducting portion 5 and the second heat-conducting portion 6 and is joined to the first heat-conducting portion 5 and the second heat-conducting portion 6. The first heat-conducting portion 5 and the second heat-conducting portion 6 of the electronic component 1f may, for example, each have a thickness of about 20 μm. The third heat-conducting portion 9 of the electronic component 1f may, for example, have a thickness of about 3 μm.

The third heat-conducting portion 9 may be, for example, a metal film. The metal film may be, for example, made of copper. It is not required that the metal film be made of copper. The metal film may be made of a copper alloy. Alternatively, the metal film may be, for example, made of metal such as aluminum, platinum, gold, silver, titanium, nickel, chromium, molybdenum, or tungsten or may be made of an alloy containing any one of these metals as a principal component. The metal film may have a monolayer structure or a multilayer structure. It is not required that the third heat-conducting portion 9 be made of metal. The third heat-conducting portion 9 may be, for example, made of aluminum nitride, silicon nitride, sapphire, or diamond. The third heat-conducting portion 9 may include an aluminum nitride film on the principal surface 22 of the substrate 2 and a metal film stacked on the aluminum nitride film.

A method for producing the electronic component 1f according to Preferred Embodiment 3 is substantially the same as the method for producing the electronic component 1 described in relation to the method for producing the electronic component module 100 according to Preferred Embodiment 1. The method for producing the electronic component 1f according to Preferred Embodiment 3 may involve the following process. In forming the first heat-conducting portion 5, the second heat-conducting portion 6, and the third heat-conducting portion 9, a seed layer is formed on the principal surface 22 of the substrate 2, and regions that are part of the seed layer and are to be formed into the first heat-conducting portion 5 and the second heat-conducting portion 6 are plated, with the other regions of the seed layer being masked off by an appropriate means.

Table 1 shows the results of simulations conducted on electronic component modules that did not include the sealing resin portion 20 and were otherwise structurally similar to the electronic component module 100f. The simulations were conducted to determine the temperature of the functional portions 3 of each of the electronic components in operation. More specifically, Table 1 shows the temperature of the functional portions 3 of the electronic components with varying thickness of the third heat-conducting portion 9 for the cases in which the first heat-conducting portion 5 and the second heat-conducting portion 6 each had (i) a thickness of 20 μm, (ii) a thickness of 10 μm, and (iii) a thickness of 5 μm. The first heat-conducting portion 5, the second heat-conducting portion 6, and the third heat-conducting portion 9 of each of the electronic components used in the simulations were made of copper.

TABLE 1

| Thickness (μm) of Third Heat-Conducting Portion | Temperature (° C.) of Functional Portions @ 20 μm | Temperature (° C.) of Functional Portions @ 10 μm | Temperature (° C.) of Functional Portions @ 5 μm |
| --- | --- | --- | --- |
| 0 | 294.9 | 301.8 | 305.5 |
| 0.2 | 294.208 | — | — |
| 0.5 | — | 300.969 | 304.7 |
| 1.0 | 293.9 | 300.958 | 304.7 |
| 2.0 | 294.203 | 301.3 | 305.1 |
| 3.0 | 294.6 | — | 305.5 |
| 3.5 | — | 301.8 | — |
| 4.0 | 294.9 | — | — |
| 5.0 | 295.4 | 302.6 | 306.5 |
| 10 | 297.7 | 305.1 | — |
| 15 | 300.0 | — | — |
| 20 | 302.5 | — | — |

Figure 11:
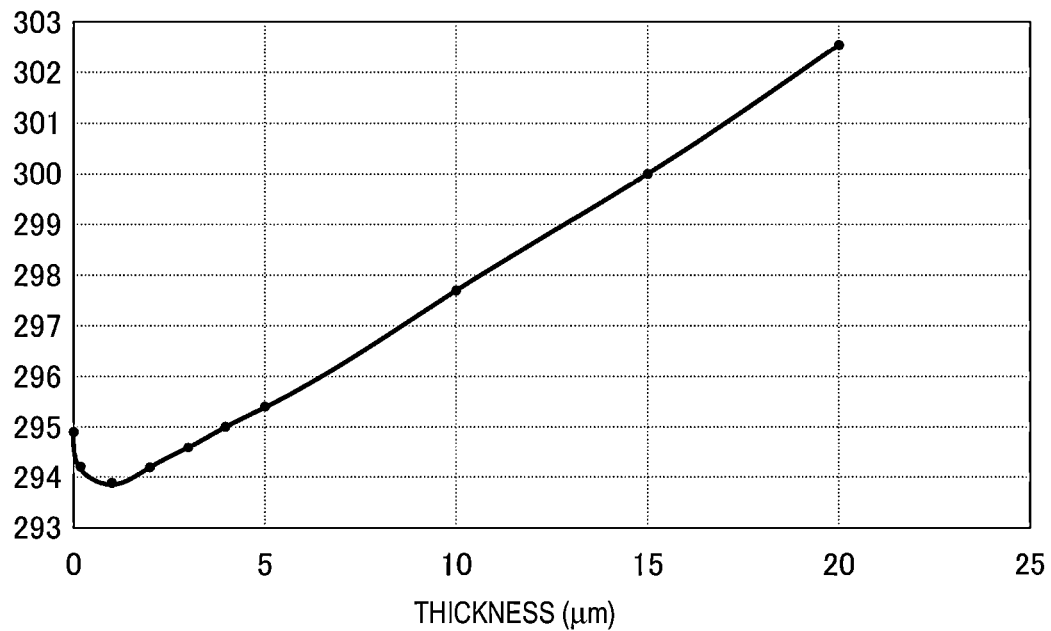
FIG. 11 is a graph illustrating the result of simulations conducted to determine the relationship between the thickness of heat-conducting portions and the temperature of functional portions.

FIG. 11 illustrates the relationship between the thickness of the third heat-conducting portion 9 and the temperature of the functional portions 3 for the case in which the first heat-conducting portion 5 and the second heat-conducting portion 6 each had a thickness of 20 μm (see Table 1). The horizontal axis of the graph in FIG. 11 represents the thickness of the third heat-conducting portion 9, and the vertical axis of the graph represents the temperature of the functional portions 3. It can be seen from FIG. 11 that the third heat-conducting portion 9 thinner than each of the first heat-conducting portion 5 and the second heat-conducting portion was of benefit to the electronic component 1*f* and the electronic component module 100*f*; that is, the temperature of the functional portions 3 of the electronic component 1*f* was lower than the temperature of the electronic component including the third heat-conducting portion 9 whose thickness was equal to the thickness of each of the first heat-conducting portion 5 and the second heat-conducting portion 6, or more specifically, was lower than the temperature of the electronic component including a 20-micrometer-thick metal film formed on the entirety of the principal surface 22 of the substrate 2. The third heat-conducting portion 9 thinner than each of the first heat-conducting portion 5 and the second heat-conducting portion thus leads to an improvement in the thermal dissipation properties of the electronic component 1*f* and an improvement in the thermal dissipation properties of the electronic component module 100*f*.

In light of the suppression of increases in the temperature of the functional portions 3 and with consideration given to component-to-component variations, the thickness of the third heat-conducting portion 9 of the electronic component 1*f* for the case in which the first heat-conducting portion 5 and the second heat-conducting portion 6 each have a thickness of about 20 µm is preferably equal to or less than one half of the thickness of each of the first heat-conducting portion 5 and the second heat-conducting portion 6 and is more preferably equal to or less than a quarter of the thickness of each of the first heat-conducting portion 5 and the second heat-conducting portion 6.

The relationship between the thickness of the third heat-conducting portion 9 and the temperature of the functional portions 3 was analyzed at a greater level of detail than is shown in Table 1. The results of analysis are as follows. In the case that the first heat-conducting portion 5 and the second heat-conducting portion 6 of the electronic component 1*f* each had a thickness of about 20 µm, the level of heat dissipation achieved through the use of the third heat-conducting portion 9 having a thickness of about 3.6675 µm or less was as high as the level of heat dissipation for the case in which the thickness of the third heat-conducting portion 9 was 0 µm. In the case that the first heat-conducting portion 5 and the second heat-conducting portion 6 of the electronic component 1*f* each had a thickness of about 10 µm, the level of heat dissipation achieved through the use of the third heat-conducting portion 9 having a thickness of about 3.349 µm or less was as high as the level of heat dissipation for the case in which the thickness of the third heat-conducting portion 9 was 0 µm. In the case that the first heat-conducting portion 5 and the second heat-conducting portion 6 of the electronic component 1*f* each had a thickness of about 5 µm, the level of heat dissipation achieved through the use of the third heat-conducting portion 9 having a thickness of about 3.053 µm or less was as high as the level of heat dissipation for the case in which the thickness of the third heat-conducting portion 9 was 0 µm. The results led to the conclusion that in the case that the inequality $Y \leq 0.476 \times \log_e X + 2.240$ holds, the level of heat dissipation in the electronic component 1*f* is as high as the level of heat dissipation for the case in which the thickness of the third heat-conducting portion 9 is 0 µm, that is, for the case in which the third heat-conducting portion 9 is not provided (as in the electronic component 1 according to Preferred Embodiment 1). X denotes the thickness of each of the first heat-conducting portion 5 and the second heat-conducting portion 6 in units of µm, Y denotes the thickness of the third heat-conducting portion 9 in units of µm, and $\log_e$ denotes a natural logarithm.

Preferred Embodiment 4

Figure 12:
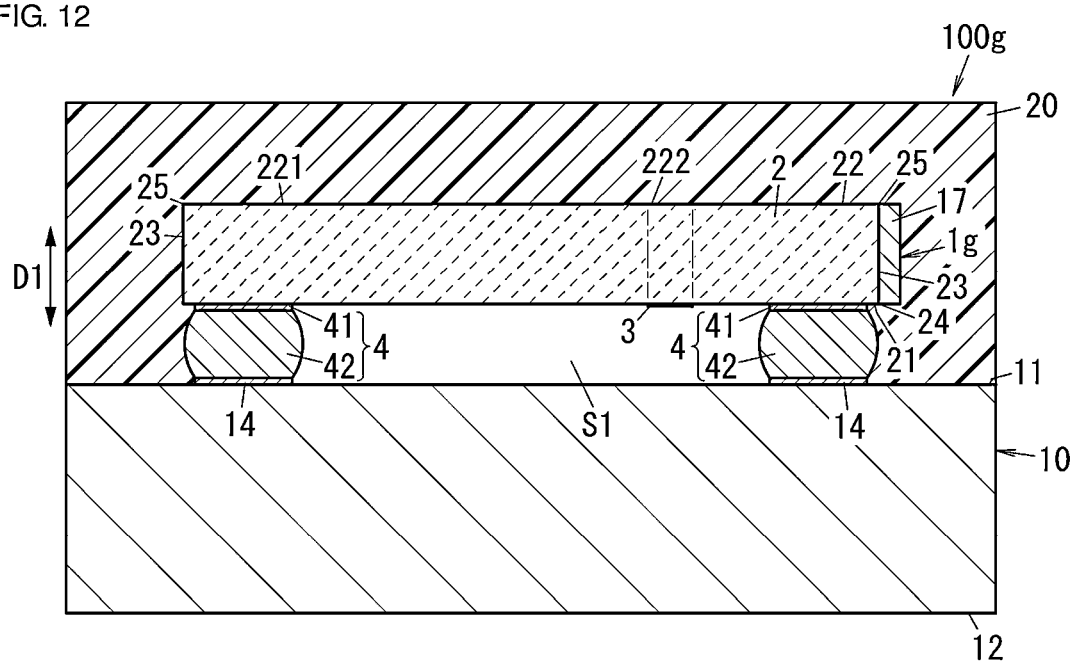
FIG. 12 is a sectional view of an electronic component module including an electronic component according to Preferred Embodiment 4 of the present invention.

The following describes, with reference to FIG. 12, an electronic component 1*g* according to Preferred Embodiment 4 and an electronic component module 100*g*, which includes the electronic component 1*g*.

The electronic component 1*g* according to Preferred Embodiment 4 differs from the electronic component 1 according to Preferred Embodiment 1 (see FIGS. 1 and 2) in that the electronic component 1*g* does not include the first heat-conducting portion 5 and the second heat-conducting portion 6 on the principal surface 22 of the substrate 2 and includes a heat-conducting portion 17, which is disposed on only the side surface 23 that is closer than the other three side surfaces 23 to the functional portion 3. The thermal conductivity of the heat-conducting portion 17 is higher than the thermal conductivity of the substrate 2. Elements of the electronic component 1*g* according to Preferred Embodiment 4 that are similar to the elements of the electronic component 1 according to Preferred Embodiment 1 are denoted by the same reference signs, and redundant description thereof will be omitted. The same holds for the components of the electronic component module 100*g* according to Preferred Embodiment 4 that are similar to the components of the electronic component module 100 according to Preferred Embodiment 1.

The heat-conducting portion 17 may be, for example, a metal film. The metal film may be, for example, made of copper. It is not required that the metal film be made of copper. The metal film may be made of a copper alloy. Alternatively, the metal film may be, for example, made of metal such as aluminum, platinum, gold, silver, titanium, nickel, chromium, molybdenum, or tungsten or may be made of an alloy containing any one of these metals as a principal component.

A method for producing the electronic component 1*g* according to Preferred Embodiment 4 is substantially the same as the method for producing the electronic component 1 described in relation to the method for producing the electronic component module 100 according to Preferred Embodiment 1. The method for producing the electronic component 1*g* according to Preferred Embodiment 4 may involve the following process. In forming the heat-conducting portion 17, the side surface 23 that is closer than the other three side surfaces 23 of the substrate 2 to the functional portion 3 are plated, with the principal surface 22 of the substrate 2 and the other three side surfaces 23 being masked off by an appropriate means. Alternatively, a metal film may be formed on a region including the principal surface 22 of the substrate 2. In this case, the metal film may be ground with a grinding device or the like such that unwanted portions are removed from the metal film, which is patterned accordingly. The metal film may be patterned by any means.

The electronic component 1*g* according to Preferred Embodiment 4 includes the substrate 2, the functional portion 3, the external connection conductor portions 4, and the heat-conducting portion 17. The substrate 2 includes the principal surface 21, the principal surface 22, and four side surfaces 23. The functional portion 3 is disposed on the principal surface 21 of the substrate 2. The functional portion 3 generates heat during operation. The external connection conductor portions 4 are disposed directly on the principal surface 21 of the substrate 2 or disposed below the principal surface 21 without direct contact with the substrate 2. The heat-conducting portion 17 is disposed on only the side surface 23 that is closer than the other three side surfaces 23 of the substrate 2 to the functional portion 3 or disposed beside the side surface 23 only without direct contact with the substrate 2. The thermal conductivity of the heat-conducting portion 17 is higher than the thermal conductivity of the substrate 2. The heat-conducting portion 17 is disposed neither on the principal surface 22 of the substrate 2 nor on the principal surface 21 of the substrate 2.

The heat-conducting portion 17 is disposed on only the side surface 23 that is closer than the other three side surfaces 23 of the substrate 2 to the functional portion 3 and is not disposed on the principal surface 22 of the substrate 2. This feature enables the electronic component 1g according to Preferred Embodiment 4 to achieve superiority over the electronic component 1 according to Preferred Embodiment 1, in which the first heat-conducting portion 5 and the second heat-conducting portion 6 are disposed on the principal surface 22 of the substrate 2. More specifically, this feature yields heat dissipation effect and enables a reduction in the height of the electronic component. The electronic component 1g according to Preferred Embodiment 4 is thus expected to find uses in areas where severe restrictions on the height of components are introduced.

These preferred embodiments including Preferred Embodiments 1 to 4, which have been described so far, are merely example preferred embodiments of the present invention. Various alterations may be made to Preferred Embodiments 1 to 4 in accordance with, for example, designs in such a manner that various advantages of preferred embodiments of the present invention are achieved.

Other Modifications

It is not required that the second heat-conducting portion 6 of the electronic component 1 (see FIGS. 1 and 2) lie on all of the second region 222 and a portion of the first region 221 as in Preferred Embodiment 1. It is only required that the second heat-conducting portion 6 be disposed directly on a region that is a portion of the principal surface 22 of the substrate 2 and including at least a portion of the second region 222 or disposed over the region without direct contact with the substrate 2 and be discretely spaced away from the first heat-conducting portion 5 when viewed in plan in the thickness direction D1 of the substrate 2.

It is not required that the shape of the substrate 2 viewed in plan in the thickness direction D1 of the substrate 2 be rectangular or substantially rectangular. In some preferred embodiments, the shape of the substrate 2 is square or substantially square. It is not required that the substrate 2 be made of silicon (Si). In some preferred embodiments, the substrate 2 is made of lithium niobate, lithium tantalate, quartz, or glass.

It is not required that the substrate 2 have four side surfaces 23. In some preferred embodiments, the edges of the substrate 2 are chamfered such that the substrate 2 includes more than four side surfaces 23.

It is not required that the aforementioned piezoelectric substrate be used as the substrate 2 of the electronic component 1 that is an acoustic wave device. In some preferred embodiments, the substrate 2 is a multilayer substrate that exhibits piezoelectricity. More specifically, the substrate that exhibits piezoelectricity may be, for example, a multilayer substrate including a support substrate, a low-acoustic-velocity film, and a piezoelectric film.

The low-acoustic-velocity film is disposed directly on the support substrate or disposed over the support substrate without direct contact with the support substrate. The piezoelectric film is disposed directly on the low-acoustic-velocity film or disposed over the low-acoustic-velocity film without direct contact with the low-acoustic-velocity film. The acoustic velocity of a bulk wave propagating through the low-acoustic-velocity film is lower than the velocity of an acoustic wave propagating through the piezoelectric film. The acoustic velocity of a bulk wave propagating through the support substrate is higher than the velocity of an acoustic wave propagating through the piezoelectric film. The piezoelectric film, the low-acoustic-velocity film, and the support substrate may be, for example, made of lithium tantalate, silicon oxide, or silicon. The piezoelectric layer has a thickness of about $3.5\lambda$ or less, for example, where $\lambda$ denotes the wavelength of the acoustic wave and is determined by the electrode-finger period of the IDT electrode. The low-acoustic-velocity film may, for example, have a thickness of about $2.0\lambda$ or less.

The following describes the electronic component 1 including the substrate 2 that is a multilayer substrate including a piezoelectric film, a low-acoustic-velocity film, and a support substrate. The piezoelectric film and the low-acoustic-velocity film are each larger than the support substrate when viewed in plan in the thickness direction of the substrate 2. The external connection conductor portions 4 overlap neither the piezoelectric film nor the low-acoustic-wave film when viewed in the thickness direction D1 of the substrate 2. Each of the external connection conductor portions 4 are disposed below the support substrate with, for example, an electrical insulating layer being disposed therebetween. The electrical insulating layer may be, for example, made of a polyimide resin, an epoxy resin, silicon oxide, or silicon nitride.

The materials of the piezoelectric film, the low-acoustic-velocity film, and the support substrate are not limited to those mentioned above. The piezoelectric film may be, for example, made of lithium tantalate, lithium niobate, zinc oxide (ZnO), aluminum nitride (AlN), or lead zirconate titanate (PZT). The low-acoustic-velocity film may be made of at least one material selected from the group consisting of silicon oxide, glass, silicon oxynitride, tantalum oxide, a compound formed by adding fluorine to silicon oxide, a compound formed by adding carbon to silicon oxide, and a compound formed by adding boron to silicon oxide. The support substrate may be made of at least one material selected from the group consisting of silicon, aluminum nitride, aluminum oxide, silicon carbide, silicon nitride, sapphire, lithium tantalate, lithium niobate, quartz, alumina, zirconia, cordierite, mullite, steatite, forsterite, magnesia, and diamond.

The substrate that exhibits piezoelectricity may, for example, include an adhesive layer disposed between the low-acoustic-velocity film and the piezoelectric film. The adhesive layer may be, for example, made of resin such as an epoxy resin or a polyimide resin. The substrate that exhibits piezoelectricity may, for example, include a dielectric film disposed between the low-acoustic-velocity film and the piezoelectric film, a dielectric film disposed on the piezoelectric film, or a dielectric disposed below the low-acoustic-velocity film.

The substrate that exhibits piezoelectricity may be, for example, a multilayer substrate including a support substrate, a high-acoustic-velocity film, a low-acoustic-velocity film, and a piezoelectric film.

The high-acoustic-velocity film is disposed directly on the support substrate or disposed over the support substrate without direct contact with the support substrate. The low-acoustic-velocity film is disposed directly on the high-acoustic-velocity film or disposed over the high-acousticvelocity film without direct contact with the high-acoustic-velocity film. The piezoelectric film is disposed directly on the low-acoustic-velocity film or disposed over the low-acoustic-velocity film without direct contact with the low-acoustic-velocity film. The acoustic velocity of a bulk wave propagating through the high-acoustic-velocity film is higher than the velocity of an acoustic wave propagating through the piezoelectric film. The acoustic velocity of a bulk wave propagating through the low-acoustic-velocity film is lower than the velocity of an acoustic wave propagating through the piezoelectric film.

Examples of the material of the high-acoustic-velocity film include: piezoelectric materials such as diamond-like carbon, aluminum nitride, aluminum oxide, silicon carbide, silicon nitride, silicon, sapphire, lithium tantalate, lithium niobate, and quartz; various ceramics such as alumina, zirconia, cordierite, mullite, steatite, and forsterite; magnesia; diamond; materials containing any of the above materials as a principal component; and materials containing a mixture of the above materials as a principal component.

The high-acoustic-velocity film traps surface acoustic waves in the piezoelectric film and the low-acoustic-velocity film. Thus, thicker high-acoustic-velocity films are more desirable. The substrate that exhibits piezoelectricity may include, in addition to the high-acoustic-velocity film, the low-acoustic-velocity film, and the piezoelectric film, films such as an adhesive layer and a dielectric film.

The acoustic wave device configured as any one of the electronic components 1 and 1a to 1g is not limited to a surface acoustic wave (SAW) resonator and may be, for example, a bulk acoustic wave (BAW) resonator.

The BAW resonator includes a substrate, a first electrode, a piezoelectric material film, and a second electrode. The first electrode is disposed on the substrate. The piezoelectric material film is disposed on the first electrode. The second electrode is disposed on the piezoelectric material film.

The substrate of the BAW resonator may, for example, include a silicon substrate and an electrical insulating film on the silicon substrate. The electrical insulating film may be, for example, a silicon oxide film. The piezoelectric material film may be, for example, made of lead zirconate titanate (PZT).

The substrate of the BAW resonator includes a cavity, which is on a surface of the first electrode opposite to another surface on which the piezoelectric material film is disposed. Such a BAW resonator is known as a film bulk acoustic resonator (FBAR). The BAW resonator configured as an FBAR is not limited to the structure mentioned above. The functional portions 3 of the electronic component 1 configured as a BAW resonator is part of the multilayer body including the first electrode, the piezoelectric material film, and the second electrode and overlap the cavity when viewed in the thickness direction of the substrate.

It is not required that the BAW resonator be configured as FBAR. The BAW resonator may, for example, a solidly mounted resonator (SMR).

It is not required that the electronic component 1 be an acoustic wave device. It is only required that the electronic component 1 be an electronic component in chip form and include a functional portion that generates heat during operation. The electronic component 1 may be an active component or a passive component. The electronic component 1 may be, for example, a semiconductor chip such as a power amplifier, a low-noise amplifier, a DC-to-DC converter, an integrated circuit (IC), an intelligent power device (IPD), or a microprocessing unit (MPU). It is not required that the electronic component 1 be an acoustic wave device or a semiconductor chip. The electronic component 1 may be any electronic component including a functional portion that generates heat during periods of use. It is thus not required that the substrate 2 be a piezoelectric substrate. The substrate 2 may be, for example, a silicon substrate, a germanium substrate, a compound semiconductor substrate, an epitaxial substrate, or a ceramic base body. The selection as to which of these to use is made in accordance with the functions and types of the electronic components 1 and 1a to 1g.

The electronic component 1 may include a plurality of functional portions, or more specifically, may include: functional portions that generate a comparatively large amount of heat; and functional portion that generate a comparatively small amount of heat. The functional portions 3 preferably generate a comparatively large amount of heat; that is, functional portions that generate a comparatively small amount of heat are optional. It is preferred that at least one of the plurality of functional portions 3 of the electronic components 1 be a functional portion that heats up to a first predetermined temperature (e.g., about 80° C.) or above during operation. It is not always required that more than one functional portion 3 that heats up to the first predetermined temperature or above during operation be included in the electronic component 1. In this case, one or more functional portions 3 that heat up to a temperature equal to or lower than a second predetermined temperature (e.g., about 80° C.) during operation are optional. For example, one or more functional portions 3 that heat up to a temperature equal to or higher than about 30° C. or and lower than about 80° C. are optional. The first predetermined temperature and the second predetermined temperature are each not limited to about 80° C. and may be adjusted in accordance with the allowable temperatures of the functional portions and the temperature characteristics of the functional portions. The first predetermined temperature is equal to the second predetermined temperature. In some preferred embodiments, the first predetermined temperature is not equal to the second predetermined temperature.

The electronic component 1 that is a power amplifier or a low-noise amplifier includes one or more functional portions 3 capable of amplification. The one or more functional portions 3 may each, for example, be a transistor portion, such as heterojunction bipolar transistor (HBT).

The electronic component 1 that is a DC-to-DC converter includes one or more functional portions 3 capable of power conversion. The DC-to-DC converter may be, for example, a single-chip switching regulator.

The electronic component 1 that is an MPU includes one or more functional portions 3 capable of logical operation. The one or more functional portions 3 may each, for example, be a register, an arithmetic circuit, or a control circuit.

It is not required that all of the external connection conductor portions 4 of the electronic component 1 be discretely spaced away from the functional portions 3 when viewed in plan in the thickness direction D1 of the substrate 2. In some preferred embodiments, the electronic component 1 may include one or more external connection conductor portions 4 discretely spaced away from the functional portions 3 and one or more external connection conductor portions 4 that overlap the functional portions 3 when viewed in plan in the thickness direction D1 of the substrate 2. The external connection conductor portions 4 that overlap the functional portions 3 may be, for example, connected to the functional portions 3 through a redistribution layer.

It is not required that the first heat-conducting portion 5 of the electronic component 1 be opposite to external connection conductor portions 4 in the thickness direction D1 of the substrate 2 with the substrate 2 being located between the first heat-conducting portion 5 and the external connection conductor portions 4. It is only required that the first heat-conducting portion 5 of the electronic component 1 be opposite to at least one of the external connection conductor portions 4. This configuration is good enough for the electronic component 1 to achieve an improvement in thermal dissipation properties. It is not required that the heat-conducting portion of the electronic component 1d be opposite to external connection conductor portions 4 in the thickness direction D1 of the substrate 2 with the substrate 2 being located between the heat-conducting portion 5 and the external connection conductor portions 4. It is only required that the first heat-conducting portion 5 of the electronic component 1d be opposite to at least one of the external connection conductor portions 4. This configuration is good enough for the electronic component 1d to achieve an improvement in thermal dissipation properties.

Figure 13:
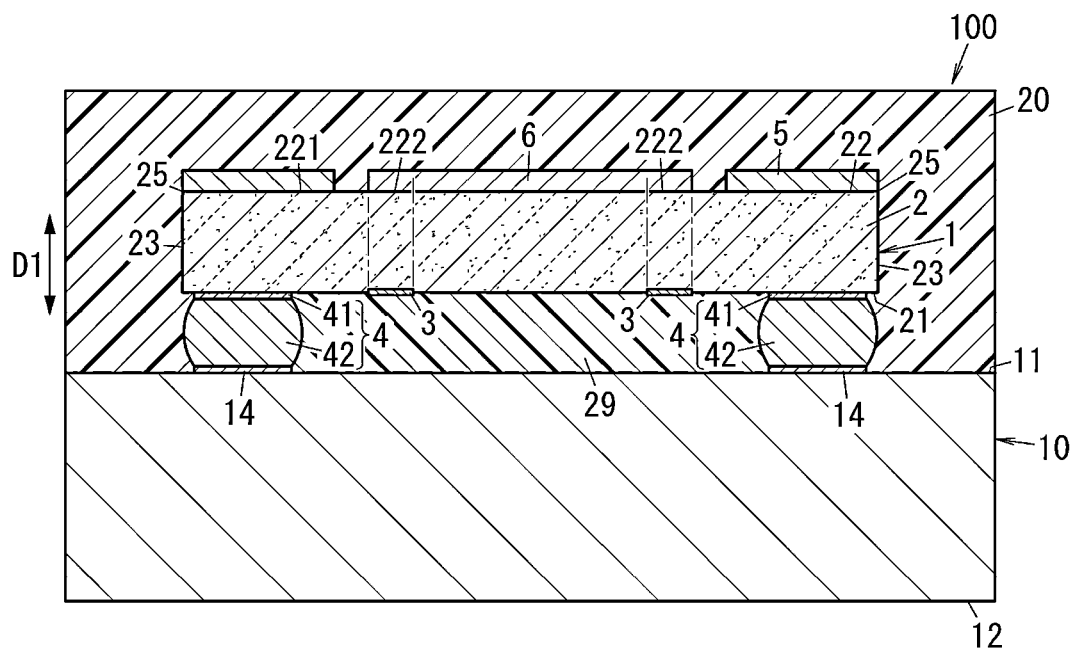
FIG. 13 is a sectional view of an electronic component module including an electronic component according to another modification of a preferred embodiment of the present invention.

It is only required that the electronic component 1 included in the electronic component module 100 be covered with the sealing resin portion 20 at least on the principal surface 11 of the wiring board 10. In some preferred embodiments, side surfaces of the wiring board 10 are partially or entirely covered with the sealing resin portion 20. The electronic component module 100 may optionally include the sealing resin portion 20. The space S1 in the electronic component module 100 may be eliminated depending on the function of the functional portions 3 of the electronic component 1. In the case that the functional portions 3 are transistor portions such as HBTs, the electronic component module 100 may include a resin portion (underfill portion) 29, which is enclosed with the electronic component 1, the wiring board 10, and the sealing resin portion 20 as illustrated in FIG. 13.

The electronic component module 100 includes one electronic component 1 mounted the wiring board 10. In some preferred embodiments, more than one electronic component 1 is mounted on the wiring board 10.

CONCLUSION

While the preferred embodiments are described as above, the following aspects are herein disclosed.

According to a first aspect, an electronic component (1; 1a; 1b; 1c) includes a substrate (2), a functional portion (3), a plurality of external connection conductor portions (4), a first heat-conducting portion (5), and a second heat-conducting portion (6). The substrate (2) includes two principal surfaces with one principal surface (21) being opposite to other principal surface (22). The functional portion (3) is disposed on the one principal surface (21) of the substrate (2). The functional portion (3) generates heat during operation. The plurality of external connection conductor portions (4) are disposed directly on the one principal surface (21) of the substrate (2) or disposed below the one principal surface (21) without direct contact with the substrate (2). The other principal surface (22) of the substrate (2) includes a first region (221) and a second region (222). When viewed in plan in a thickness direction (D1) of the substrate (2), the first region (221) does not overlap the functional portion (3), and the second region (222) coincides with the functional portion (3). The first heat-conducting portion (5) is disposed directly on all or a portion of the first region (221) or disposed over all or a portion of the first region (221) without direct contact with the substrate (2). Thermal conductivity of the first heat-conducting portion (5) is higher than thermal conductivity of the substrate (2). The second heat-conducting portion (6) is disposed directly on a region that is a portion of the other principal surface (22) of the substrate (2) and including at least a portion of the second region (222) or disposed over the region without direct contact with the substrate (2) and is discretely spaced away from the first heat-conducting portion (5) when viewed in plan in the thickness direction (D1) of the substrate (2). Thermal conductivity of the second heat-conducting portion (6) is higher than thermal conductivity of the substrate (2). When viewed in plan in the thickness direction (D1) of the substrate (2), a region that is a portion of the other principal surface (22) of the substrate (2) and located between the first heat-conducting portion (5) and the second heat-conducting portion (6) is not overlaid with a heat-conducting portion whose thermal conductivity is higher than the thermal conductivity of the substrate (2).

The electronic component (1; 1a; 1b; 1c) according to the first aspect yields an improvement in thermal dissipation properties.

According to a second aspect, the first heat-conducting portion (5) of the electronic component (1; 1a; 1b; 1c) according to the first aspect is opposite to plurality of external connection conductor portions (4) in the thickness direction (D1) of the substrate (2) with the substrate (2) being located between the first heat-conducting portion (5) and the plurality of external connection conductor portions (4).

The electronic component (1; 1a; 1b; 1c) according to the second aspect yields an improvement in thermal dissipation properties.

According to a third aspect, the substrate (2) of the electronic component (1a; 1b; 1c) according to the first or second aspect includes at least four side surfaces (23). The electronic component (1a; 1b; 1c) further includes a lateral heat-conducting portion (7). The lateral heat-conducting portion (7) is disposed directly on at least one of the at least four side surfaces (23) of the substrate (2) or disposed beside at least one of the at least four side surfaces (23) without direct contact with the substrate (2). Thermal conductivity of the lateral heat-conducting portion (7) is higher than the thermal conductivity of the substrate (2).

The electronic component (1a; 1b; 1c) according to the third aspect yields a further improvement in thermal dissipation properties.

According to a fourth aspect, the lateral heat-conducting portion (7) of the electronic component (1a; 1b; 1c) according to the third aspect extends from an edge line (25) to another edge line (24) of the substrate (2), the one edge line (25) being a line where one of the at least four side surfaces (23) corresponding to the lateral heat-conducting portion (7) meets the other principal surface (22), the other edge line (24) being a line where the side surface (23) corresponding to the lateral heat-conducting portion (7) meets the one principal surface (21).

Thus, the physical distance between the lateral heat-conducting portion (7) and the external connection conductor portion (4) close to the lateral heat-conducting portion (7) is shorter in this layout than in the case that the lateral heat-conducting portion (7) does not extend to the edge line (24). The electronic component (1a; 1b; 1c) according to the fourth aspect yields an improvement in thermal dissipation properties accordingly.

According to a fifth aspect, the substrate (2) of the electronic component (1a; 1b; 1c) according to the first or second aspect includes at least four side surfaces (23). The electronic component (1a; 1b; 1c; 1d; 1e) further includes a lateral heat-conducting portion (7). The lateral heat-conducting portion (7) is disposed directly on at least one of the at least four side surfaces (23) of the substrate (2) or disposed beside at least one of the at least four side surfaces (23) without direct contact with the substrate (2). Thermal conductivity of the lateral heat-conducting portion (7) is higher than the thermal conductivity of the substrate (2). At least a portion of the lateral heat-conducting portion (7) is opposite to functional portion (3) with one of the plurality of external connection conductor portions (4) being located therebetween.

The lateral heat-conducting portion (7) is physically close to the external connection conductor portion (4). This layout enables the electronic component (1a; 1b; 1c) according to the fifth aspect to yield an improvement in thermal dissipation properties.

According to a sixth aspect, the lateral heat-conducting portion (7) and the first heat-conducting portion (5) of the electronic component (1a; 1b; 1c) according to the fifth aspect are joined to each other.

The electronic component (1a; 1b; 1c) according to the sixth aspect yields an improvement in thermal dissipation properties.

According to a seventh aspect, an electronic component (1d; 1e) includes a substrate (2), a functional portion (3), a plurality of external connection conductor portions (4), and a heat-conducting portion (5). The substrate (2) includes two principal surfaces with one principal surface (21) being opposite to other principal surface (22). The functional portion (3) is disposed on the one principal surface (21) of the substrate (2). The functional portion (3) generates heat during operation. The plurality of external connection conductor portions (4) are disposed directly on the one principal surface (21) of the substrate (2) or disposed below the one principal surface (21) without direct contact with the substrate (2). The other principal surface (22) of the substrate (2) includes a first region (221) and a second region (222). When viewed in plan in a thickness direction (D1) of the substrate (2), the first region (221) does not overlap the functional portion (3), and the second region (222) coincides with the functional portion (3). The first heat-conducting portion (5) is disposed directly on a region that is a portion of the other principal surface (22) of the substrate (2) and including at least a portion of the first region (221) or disposed over the region without direct contact with the substrate (2). Thermal conductivity of the heat-conducting portion (5) is higher than thermal conductivity of the substrate (2). The second region (222) is not entirely overlaid with the heat-conducting portion (5) when viewed in plan in the thickness direction (D1) of the substrate (2).

The electronic component (1d; 1e) according to the seventh aspect yields an improvement in thermal dissipation properties.

According to an eighth aspect, the heat-conducting portion (5) of the electronic component (1d; 1e) according to the seventh aspect is opposite to at least one of the plurality of external connection conductor portions (4) in the thickness direction (D1) of the substrate (2) with the substrate (2) being located between the heat-conducting portion (5) and the at least one of the plurality of external connection conductor portions (4).

The electronic component (1d; 1e) according to the eighth aspect yields an improvement in thermal dissipation properties.

According to a ninth aspect, the substrate (2) of the electronic component (1d; 1e) according to the seventh or eighth aspect includes four side surfaces (23). The electronic component (1d; 1e) further includes a lateral heat-conducting portion (7). The lateral heat-conducting portion (7) is disposed directly on at least one of the at least four side surfaces (23) or disposed beside at least one of the at least four side surfaces (23) without direct contact with the substrate (2). Thermal conductivity of the lateral heat-conducting portion (7) is higher than the thermal conductivity of the substrate (2).

The electronic component (1d; 1e) according to the ninth aspect yields a further improvement in thermal dissipation properties.

According to a tenth aspect, the substrate (2) of the electronic component (1d; 1e) according to the seventh or eighth aspect includes at least four side surfaces (23). The electronic component (1d; 1e) further includes a lateral heat-conducting portion (7). The lateral heat-conducting portion (7) is disposed directly on at least one of the at least four side surfaces (23) or disposed beside at least one of the at least four side surfaces (23) without direct contact with the substrate (2). Thermal conductivity of the lateral heat-conducting portion (7) is higher than the thermal conductivity of the substrate (2). At least a portion of the lateral heat-conducting portion (7) is opposite to functional portion (3) with one of the plurality of external connection conductor portions (4) being located therebetween.

The lateral heat-conducting portion (7) is physically close to the external connection conductor portion (4). This layout enables the electronic component (1d; 1e) according to the tenth aspect to yield an improvement in thermal dissipation properties.

According to an eleventh aspect, the lateral heat-conducting portion (7) and the first heat-conducting portion (5) of the electronic component (1d) according to the tenth aspect are joined to each other.

The electronic component (1d) according to the eleventh aspect yields an improvement in thermal dissipation properties.

According to a twelfth aspect, an electronic component (1f) includes a substrate (2), a functional portion (3), a plurality of external connection conductor portions (4), a first heat-conducting portion (5), a second heat-conducting portion (6), and a third heat-conducting portion (9). The substrate (2) includes two principal surfaces with one principal surface (21) being opposite to other principal surface (22). The functional portion (3) is disposed on the one principal surface (21) of the substrate (2). The functional portion (3) generates heat during operation. The plurality of external connection conductor portions (4) are disposed directly on the one principal surface (21) of the substrate (2) or disposed below the one principal surface (21) without direct contact with the substrate (2). The other principal surface (22) of the substrate (2) includes a first region (221) and a second region (222). When viewed in plan in a thickness direction (D1) of the substrate (2), the first region (221) does not overlap the functional portion (3), and the second region (222) coincides with the functional portion (3). The first heat-conducting portion (5) is disposed directly on a portion of the first region (221) or disposed over a portion of the first region (221) without direct contact with the substrate (2). Thermal conductivity of the first heat-conducting portion (5) is higher than thermal conductivity of the substrate (2). The second heat-conducting portion (6) is disposed directly on a region that is a portion of the other principal surface (22) of the substrate (2) and including at least a portion of the second region (222) or disposed over the region without direct contact with the substrate (2) and is discretely spaced away from the first heat-conducting portion (5) when viewed in plan in the thickness direction (D1) of the substrate (2). Thermal conductivity of the second heat-conducting portion (6) is higher than thermal conductivity of the substrate (2). The third heat-conducting portion (9) is disposed directly on a region that is a portion of the first region (221) of the other principal surface (22) of the substrate (2) and located between the first heat-conducting portion (5) and the second heat-conducting portion (6) or disposed over the region without direct contact with the substrate (2). The third heat-conducting portion (9) is joined to the first heat-conducting portion (5) and the second heat-conducting portion (6). The third heat-conducting portion (9) is thinner than each of the first heat-conducting portion (5) and the second heat-conducting portion (6).

The electronic component (1f) according to the twelfth aspect yields an improvement in thermal dissipation properties. According to the thirteenth aspect, an inequality $Y \leq 0.476 \times \log_e X + 2.240$ is satisfied for the electronic component (1f) according to the twelfth aspect, where X denotes the thickness of each of the first heat-conducting portion (5) and the second heat-conducting portion (6) in units of μm, Y denotes the thickness of the third heat-conducting portion (9) in units of μm, and $\log_e$ denotes a natural logarithm.

The level of heat dissipation achieved by the electronic component (1f) according to the thirteenth aspect is as high as the level of heat dissipation for the case in which the third heat-conducting portion (9) is not provided.

According to a fourteenth aspect, an electronic component (1g) includes a substrate (2), a functional portion (3), a plurality of external connection conductor portions (4), and a heat-conducting portion (17). The substrate (2) includes at least four side surfaces (23) and two principal surfaces with one principal surface (21) being opposite to other principal surface (22). The functional portion (3) is disposed on the one principal surface (21) of the substrate (2). The functional portion (3) generates heat during operation. The plurality of external connection conductor portions (4) are disposed directly on the one principal surface (21) of the substrate (2) or disposed below the one principal surface (21) without direct contact with the substrate (2). The heat-conducting portion (17) is disposed directly on only one of the at least four side surfaces (23) that is closer than the other side surfaces (23) of the substrate (2) to the functional portion (3) or disposed beside the side surface (23) only without direct contact with the substrate (2). Thermal conductivity of the heat-conducting portion (17) is higher than thermal conductivity of the substrate (2).

The electronic component (1g) according to the fourteenth aspect yields an improvement in thermal dissipation properties.

According to a fifteenth aspect, an electronic component module (100; 100a; 100b; 100c; 100d; 100e; 100f; 100g) includes the electronic component (1; 1a; 1b; 1c; 1d; 1e; 1f) according to any one of the first to fourteenth aspects and a wiring board (10) on which the electronic component (1; 1a; 1b; 1c; 1d; 1e; 1f) is mounted with the plurality of external connection conductor portions (4) being in contact with the wiring board (10).

The electronic component module (100; 100a; 100b; 100c; 100d; 100e; 100f; 100g) according to the fifteenth aspect yields an improvement in thermal dissipation properties.

According to a sixteenth aspect, the electronic component module (100; 100a; 100b; 100c; 100d; 100e; 100f; 100g) according to the fifteenth aspect further includes a sealing resin portion (20). The electronic component (1; 1a; 1b; 1c; 1d; 1e; 1f; 1g) on the wiring board (10) is covered with the sealing resin portion (20).

While the electronic component (1; 1a; 1b; 1c; 1d; 1e; 1f; 1g) of the electronic component module (100; 100a; 100b; 100c; 100d; 100e; 100f; 100g) according to the sixteenth aspect is sealed with the sealing resin portion (20), heat generated in the functional portion (3) can be less prone to be dissipated through the substrate (2) and the sealing resin portion (20). Nevertheless, the heat generated in the functional portion (3) is more prone to be transferred to the wiring board (10) through the substrate (2) and the external connection conductor portions (4). In this way, the heat dissipation effect is efficiently produced.

According to a seventeenth aspect, the electronic component (1; 1a; 1b; 1c; 1d; 1e; 1f; 1g), the wiring board (10), and the sealing resin portion (20) of the electronic component module (100; 100a; 100b; 100c; 100d; 100e; 100f; 100g) according to the sixteenth aspect define a space (S1). In the electronic component module (100; 100a; 100b; 100c; 100d; 100e; 100f; 100g), the functional portion (3) faces the wiring board (10) with at least the space (S1) being defined therebetween.

Although the space (S1) in the electronic component module (100; 100a; 100b; 100c; 100d; 100e; 100f; 100g) according to the seventeenth aspect is defined between the functional portion (3) and the wiring board (10), heat generated in the functional portion (3) is more prone to be transferred to the wiring board (10) through the substrate (2) and the external connection conductor portions (4). In this way, the heat dissipation effect is efficiently produced.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
   a substrate including two principal surfaces with a first principal surface being opposite to a second principal surface;
   a functional portion that is located on the first principal surface of the substrate and generates heat during operation;
   a plurality of external connection conductor portions located directly on the first principal surface of the substrate or located below the first principal surface without direct contact with the substrate;
   a first heat-conducting portion located directly on all or a portion of a first region of the second principal surface of the substrate or located over all or a portion of the first region without direct contact with the substrate, the first region not overlapping the functional portion when viewed in plan in a thickness direction of the substrate, a thermal conductivity of the first heat-conducting portion being higher than a thermal conductivity of the substrate; and
   a second heat-conducting portion that is located directly on a region that is a portion of the second principal surface of the substrate and including at least a portion of a second region of the second principal surface or is located over the region without direct contact with the substrate, the second region coinciding with the functional portion when viewed in plan in the thickness direction of the substrate, the second heat-conducting portion being discretely spaced away from the first heat-conducting portion when viewed in plan in the thickness direction of the substrate, a thermal conductivity of the second heat-conducting portion being higher than the thermal conductivity of the substrate; wherein each of the first heat-conducting portion and the second heat-conducting portion is located closer to the second principal surface of the substrate than to the first principal surface of the substrate in the thickness direction of the substrate; and when viewed in plan in the thickness direction of the substrate, a region that is a portion of the second principal surface of the substrate and located between the first heat-conducting portion and the second heat-conducting portion is not overlaid with a heat-conducting portion with a thermal conductivity higher than the thermal conductivity of the substrate.

2. The electronic component according to claim 1, wherein the first heat-conducting portion is opposite to at least one of the plurality of external connection conductor portions in the thickness direction of the substrate with the substrate being located between the first heat-conducting portion and the at least one of the plurality of external connection conductor portions.

3. The electronic component according to claim 1, further comprising a lateral heat-conducting portion located directly on at least one of at least four side surfaces of the substrate or located beside at least one of the at least four side surfaces without direct contact with the substrate, a thermal conductivity of the lateral heat-conducting portion being higher than the thermal conductivity of the substrate, the lateral heat-conducting portion being connected to the first heat-conducting portion.

4. The electronic component according to claim 3, wherein the lateral heat-conducting portion extends from a first edge line to a second edge line of the substrate, the first edge line being a line where one of the at least four side surfaces corresponding to the lateral heat-conducting portion meets the second principal surface, the second edge line being a line where the side surface corresponding to the lateral heat-conducting portion meets the first principal surface.

5. The electronic component according to claim 1, further comprising a lateral heat-conducting portion located directly on at least one of at least four side surfaces of the substrate or located beside at least one of the at least four side surfaces without direct contact with the substrate, a thermal conductivity of the lateral heat-conducting portion being higher than the thermal conductivity of the substrate, at least a portion of the lateral heat-conducting portion being opposite to the functional portion with one of the plurality of external connection conductor portions being located therebetween.

6. The electronic component according to claim 5, wherein the lateral heat-conducting portion is connected to the first heat-conducting portion.

7. An electronic component module comprising:
   the electronic component according to claim 1; and
   a wiring board on which the electronic component is mounted with the plurality of external connection conductor portions being in contact with the wiring board.

8. The electronic component module according to claim 7, further comprising a sealing resin portion with which the electronic component on the wiring board is covered.

9. The electronic component module according to claim 8, wherein
   the electronic component, the wiring board, and the sealing resin portion of the electronic component module define a space; and
   the functional portion faces the wiring board with at least the space being defined therebetween.

* * * * *